US012772887B2

(12) United States Patent
Tseng et al.

(10) Patent No.: US 12,772,887 B2
(45) Date of Patent: Oct. 20, 2026

(54) ELECTRONIC DEVICE

(71) Applicant: MEDIATEK INC., Hsinchu City (TW)

(72) Inventors: Shu-Yuan Tseng, Hsinchu City (TW); Sheng-Yuan Fu, Hsinchu City (TW); Duen-Yi Ho, Hsinchu City (TW); Chia-Yu Jin, Hsinchu City (TW)

(73) Assignee: MEDIATEK INC., Hsinchu City (TW)

( * ) Notice: Subject to any disclaimer, the term of this patent is extended or adjusted under 35 U.S.C. 154(b) by 341 days.

(21) Appl. No.: 18/654,239

(22) Filed: May 3, 2024

(65) Prior Publication Data

US 2024/0371781 A1 Nov. 7, 2024

Related U.S. Application Data

(60) Provisional application No. 63/500,300, filed on May 5, 2023.

(51) Int. Cl.

| | |
|---|---|
| ***H10W 70/65*** | (2026.01) |
| ***H10W 70/60*** | (2026.01) |
| ***H10W 70/685*** | (2026.01) |
| ***H10W 90/00*** | (2026.01) |

(52) U.S. Cl.

CPC .......... *H10W 70/65* (2026.01); *H10W 70/611* (2026.01); *H10W 70/685* (2026.01); *H10W 90/00* (2026.01)

(58) Field of Classification Search

CPC ... H10W 70/65; H10W 70/685; H10W 90/00; H10W 70/611

USPC .......................................................... 257/734

See application file for complete search history.

(56) References Cited

U.S. PATENT DOCUMENTS

| | | | | |
|---|---|---|---|---|
| 6,426,550 B2 * | 7/2002 | Ball | H05K 1/0219 257/690 |
| 11,682,607 B2 * | 6/2023 | We | H10W 20/023 257/734 |
| 11,855,043 B1 * | 12/2023 | Farjadrad | H10W 72/00 |
| 12,029,004 B2 * | 7/2024 | Winzer | G02B 6/428 |
| 2019/0172725 A1 * | 6/2019 | Fay | H10P 74/23 |
| 2020/0075509 A1 * | 3/2020 | Baek | H10W 44/00 |
| 2022/0327276 A1 * | 10/2022 | Seshan | G06F 13/382 |
| 2023/0282585 A1 * | 9/2023 | Kang | H05K 1/111 257/776 |
| 2024/0097796 A1 * | 3/2024 | Winzer | H04B 10/503 |

* cited by examiner

*Primary Examiner* — Jami Valentine Miller

(74) *Attorney, Agent, or Firm* — McClure, Qualey & Rodack, LLP

(57) ABSTRACT

An electronic device used in the Universal Chiplet Interconnect Express (UCIe) standard is provided. The electronic device includes a substrate and first and second semiconductor devices. The first and second semiconductor devices are disposed on a top surface of the substrate. The substrate includes an interconnect structure electrically connected between the first and second semiconductor devices. The interconnect structure includes a first pad, a first signal trace and first and second via structures. The first pad is located on the top surface of the substrate. The first signal trace is covered by the first and second semiconductor devices. The first via structure is electrically connected between the first pad and the first signal trace. The second via structure is electrically connected between the first via structure and the first signal trace. The first via structure is misaligned with the second via structure.

20 Claims, 18 Drawing Sheets

ELECTRONIC DEVICE

CROSS REFERENCE TO RELATED APPLICATIONS

This application claims the benefit of U.S. Provisional Application No. 63/500,300, filed on May 5, 2023, the entirety of which is incorporated by reference herein.

BACKGROUND OF THE DISCLOSURE

Field of the Disclosure

The present disclosure relates to an electronic device and, in particular, to an interconnect structure of an electronic device used in the Universal Chiplet Interconnect Express (UCIe) standard.

Description of the Related Art

A continuous drive for higher computing power and more data bandwidth to meet the growing demands from data centers, networking, and artificial intelligence has driven the development of advanced packaging solutions for high-performance devices. Among the advanced semiconductor packaging technologies available, the interconnects used in the Universal Chiplet Interconnect Express (UCIe) standard are used to connect multiple chiplets or dies on the same package.

Although existing semiconductor package assemblies are generally adequate, they are not satisfactory in every respect. For example, it is a challenge to fulfill the requirements of the reduced fabrication cost and package size while maintaining the performance in signal integrity (SI) and power integrity (PI). Therefore, a novel semiconductor package assembly is desirable.

BRIEF SUMMARY OF THE DISCLOSURE

An embodiment of the present disclosure provides an electronic device used in the Universal Chiplet Interconnect Express (UCIe) standard. The electronic device includes a substrate, a first semiconductor device and a second semiconductor device. The substrate has a top surface and a bottom surface. The first semiconductor device and the second semiconductor device are disposed on the top surface of the substrate. The substrate includes an interconnect structure electrically connected between the first semiconductor device and the second semiconductor device. The interconnect structure includes a first pad, a first signal trace, a first via structure and a second via structure. The first pad is located on the top surface of the substrate. The first pad is covered by the first semiconductor device. The first signal trace is located below the first pad and partially covered by the first semiconductor device and the second semiconductor device. The first via structure is electrically connected between the first pad and the first signal trace. The second via structure is electrically connected between the first via structure and the first signal trace. The first signal trace extends in a first direction. The first via structure and the second via structure extend in a second direction. The first via structure is misaligned with the second via structure in the second direction.

BRIEF DESCRIPTION OF THE DRAWINGS

The present disclosure can be more fully understood by reading the subsequent detailed description and examples with references made to the accompanying drawings, wherein.

DETAILED DESCRIPTION OF THE DISCLOSURE

The following description is made for the purpose of illustrating the general principles of the disclosure and should not be taken in a limiting sense. The scope of the disclosure is best determined by reference to the appended claims.

Figure 1:
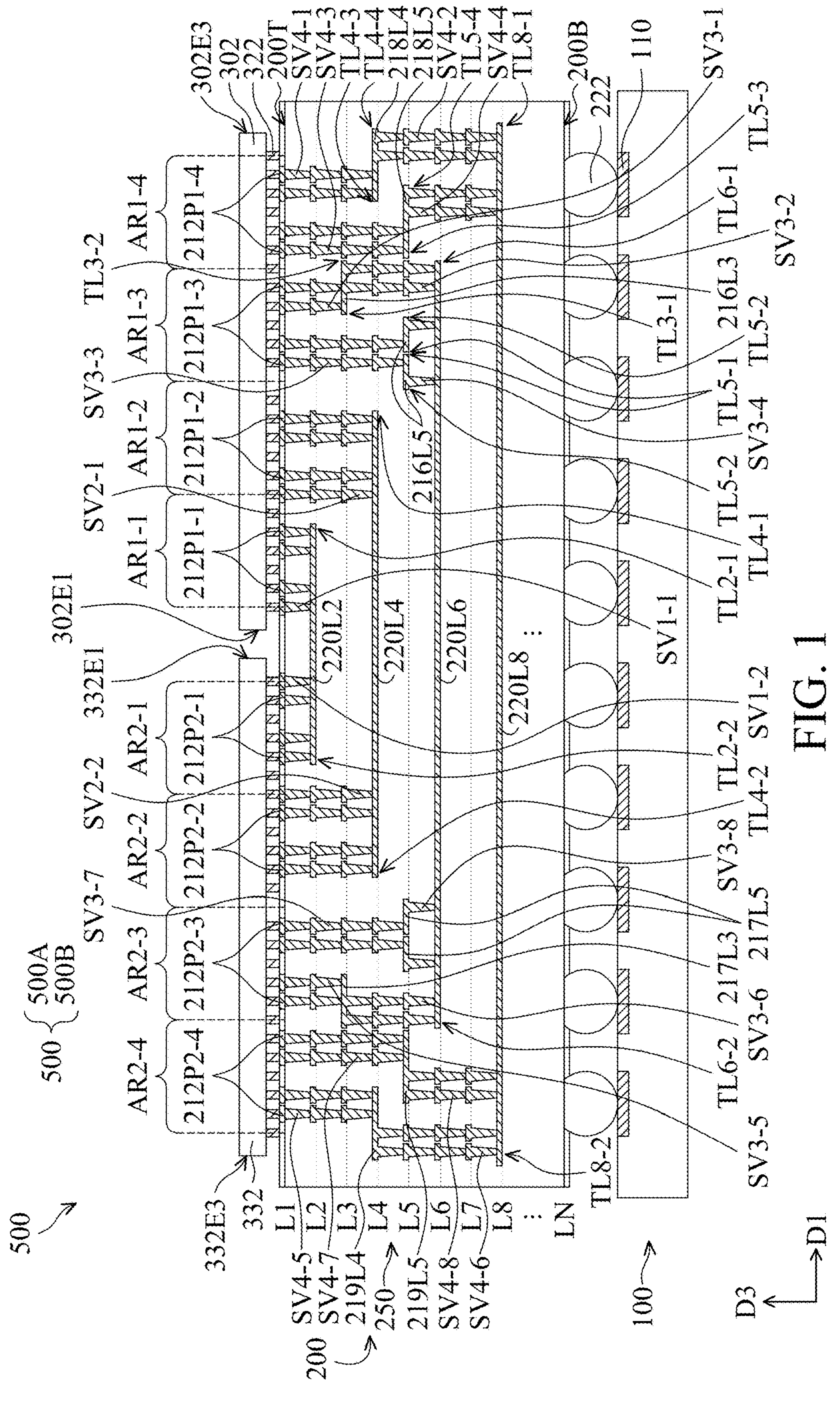
FIG. 1 is a schematic cross-sectional view of an electronic device used in the Universal Chiplet Interconnect Express (UCIe) standard in accordance with some embodiments of the disclosure, showing the arrangement of signal traces of an interconnect of a substrate.

FIG. 1 is a cross-sectional view of an electronic device 500 (including electronic devices 500A and 500B) used in the Universal Chiplet Interconnect Express (UCIe) standard, showing the arrangement of signal traces of an interconnect 250 of a substrate 200. In some embodiments, the electronic device 500 is integrated with the Universal Chiplet Interconnect Express (UCIe) standard. The electronic device 500 can be used to form a fan-out package, a two-dimensional (2D) package, 2.5D, a 2.5D package, a three-dimensional (3D) semiconductor package, or another suitable package. As shown in FIG. 1, in some embodiments, the electronic device 500 includes a base 100, a substrate 200 and semiconductor devices 302, 332.

As shown in FIG. 1, the base 100, for example a printed circuit board (PCB), may be formed of polypropylene (PP). It should also be noted that the base 100 can be a single layer or a multilayer structure. A plurality of pads 110 and/or conductive traces (not shown) is disposed on the base 100. In some embodiments, the conductive traces include signal trace segments or ground trace segments, which are used for the input/output (I/O) connections of the semiconductor devices 302, 332. In some other embodiments, the pads 110 are disposed on the base 100, connected to different terminals of the conductive traces. The pads 110 are used for the substrate 200 that is mounted directly on them. In some other embodiments, the electronic device 500 may not include the base 100.

As shown in FIG. 1, the substrate 200 may serve as a fan-out structure for the overlying semiconductor devices 302, 332. In some embodiments, the substrate 200 includes a core substrate. In some embodiments, the substrate 200 may have a top surface 200T and a bottom surface 200B. The top surface 200T of the substrate 200 is close to the semiconductor devices 302, 332, while the bottom surface 200B of the substrate 200 is close to the base 100. In some embodiments, the substrate 200 includes a package substrate or an interposer.

As shown in FIG. 1, the substrate 200 is a multi-layer substrate including at least nine levels as an example. Each level may include at least one conductive layer. For example, the substrate 200 is a N-layer substrate, in which from the topmost conductive layer to the bottommost conductive layer may be respectively located at levels L1, L2, L3, L4, L5, L6, L7, L8, . . . , LN in sequence, wherein N is a positive integer greater than or equal to 9 (i.e., N≥9). The conductive layer at each level of the substrate 200 may include pads, signal traces, power traces and ground layers. For example, the topmost conductive layer formed on the top surface 200T of the substrate 200 is located at level L1 of the substrate 200. In some embodiments, the conductive layer at level L1 includes pads (such as pads 212P1-1, 212P1-2, 212P1-3 and 212P1-4 in FIGS. 1, 2A), power traces (such as power traces 222L1 in FIG. 2A) and a topmost ground layer (such as a ground layer GL1 in FIG. 2A) and not include signal traces. In addition, semiconductor devices 302 and 332 are disposed on the top surface 200T of the substrate 200 and connected to the corresponding pads. For example, the bottommost conductive layer formed on the bottom surface 200B of the substrate 200 is located at level LN of the substrate 200. In some embodiments, the conductive layer at level LN includes pads (such as pads 224P in FIG. 2I), power traces (such as power traces 222LN in FIG. 2I) and the bottommost ground layer (such as a ground layer GLN in FIG. 2I) and not include signal traces. In some embodiments, the solder mask layers (not shown) are formed on the topmost conductive layer and the bottommost conductive layer. Moreover, directions D1 and D2 labeled in FIG. 1 are defined as the horizontal directions (the directions D1 and D2 also serve as the extending directions of the conductive layer, and a direction D3 is defined as the vertical direction (or the extending direction of the via).

In some embodiments, the substrate 200 includes an interconnect structure 250 used in the Universal Chiplet Interconnect Express (UCIe) standard (also called as an UCIe interconnect structure 250) and ground layers therein. It is noted that the interconnect structure 250 of the substrate 200 of FIG. 1 only shows the pads 212P1-1, 212P1-2, 212P1-3 and 212P1-4, signal traces 216L3, 216L5, 218L4, 218L5, 220L2, 220L4, 220L6, 220L8, 230L2, 230L3, 230L4 and 230L5, via structures SV1-1 and via structures SV3-1, SV3-2, SV3-3, SV3-4, SV4-1, SV4-2, SV4-3, SV4-4 for illustration, the remaining features may be shown in the schematic layouts of FIGS. 2A, 2B, 2C, 2D, 2E, 2F, 2G, 2H and 2I.

In some embodiments, the interconnect structure 250 extends substantially along the direction D1 and is electrically connected between the semiconductor devices 302, 332 and In addition, the interconnect structure 250 may include one or more pads (such as the pads 212P1-1, 212P1-2, 212P1-3, 212P1-4, 224P in FIGS. 1, 2A-2I, 3A-3H), signal traces (such as the signal traces 216L3, 216L5, 218L4, 218L5, 220L2, 220L4, 220L6, 220L8, 230L2, 230L3, 230L4 and 230L5 in FIGS. 1, 2A-2I, 3A-3H), power traces (such as the power traces 222L1, 222L2, 222L3, 222L5, 222L6, 222L7, 222L8 to 222LN in FIGS. 1, 2A-2I, 3A-3H), vias (such as the via structures SV1-1 in FIG. 1) and conductive pillars (not shown) disposed in one or more dielectric layers (not shown). In some embodiments, the pads, the vias, the signal traces, the power traces and the conductive pillars include a conductive material, such as metals comprising copper, gold, silver, or other applicable metals. In some embodiments, the dielectric layers may be formed of organic materials, which include a polymer base material, non-organic materials, which include silicon nitride ($SiN_x$), silicon oxide ($SiO_x$), grapheme, or the like. For example, the dielectric layers are made of a polymer base material.

As shown in FIG. 1, conductive structures 222 are disposed between the bottom surface 200B of the substrate 200 and the base 100. The conductive structures 222 are disposed on the substrate 200 away from the semiconductor devices 302, 332 and in contact with the pads (such as the pads 224P) of the substrate 200 and the corresponding pads 110 of the base 100. Therefore, the substrate 200 is electrically connected to the base 100 via the conductive structures 222. In some embodiments, the conductive structures 222 include a conductive ball structure such as a copper ball, a conductive bump structure such as a copper bump or a solder bump structure, or a conductive pillar structure such as a copper pillar structure.

In some embodiments, the electronic device 500 uses a chiplet architecture to split a large, single semiconductor die into multiple smaller functional semiconductor dies (called chiplets) fabricated in different technology nodes. Each chiplet may have improved device performance and fabrication yields. In addition, the electronic device 500A may have a reduced fabrication cost. As shown in FIG. 1, the electronic device 500A includes at least two semiconductor devices (or semiconductor modules), for example, the semiconductor device 302 and the semiconductor device 332 (also called chiplets 302 and 332) arranged side-by-side along the direction D1. In some embodiments, the semiconductor device 302 and the semiconductor device 332 are mounted on top surface 200T of the substrate 200 opposite the conductive structures 222 by a bonding process using conductive structures 322. In addition, the semiconductor device 302 is electrically connected to the semiconductor device 332 using the interconnect structure 250 used in the Universal Chiplet Interconnect Express (UCIe) standard. In some embodiments, the conductive structures 322 comprise a conductive ball structure such as a copper ball, a conductive bump structure such as a copper bump or a solder bump structure, or a conductive pillar structure such as a copper pillar structure. For example, the conductive structures 322 may be controlled collapse chip connection (C4) structures composed of conductive pillar structures (not shown) and conductive bump structures (not shown).

In some embodiments, the semiconductor device 302 and the semiconductor device 332 include semiconductor dies. Each of the semiconductor device 302 and the semiconductor device 332 independently includes a system-on-chip (SoC) die, a logic device, a memory device, a radio frequency (RF) device, the like, or any combination thereof. For example, the semiconductor device 302 and the semiconductor device 332 may each independently include a micro control unit (MCU) die, a microprocessor unit (MPU) die, a power management integrated circuit (PMIC) die, a global positioning system (GPS) device, a central processing unit (CPU) die, a graphics processing unit (GPU) die, an input-output (IO) die, a dynamic random access memory (DRAM) IP core, a static random-access memory (SRAM), a high bandwidth memory (HBM), the like, or any combination thereof. In some embodiments, the semiconductor device 302 and the semiconductor device 332 have different functions.

The semiconductor device 302 and the semiconductor device 332 may be fabricated in different technology nodes. In some embodiments, the semiconductor device 302 has a first critical dimension (CD) and the semiconductor device 332 has a second critical dimension different from the first critical dimension in order to provide different functionalities with a reduced cost. For example, the first critical dimension is narrower than the second critical dimension or vice versa. Therefore, the semiconductor device 302 and the semiconductor device 332 may respectively arrange various interfaces to fulfill the requirements of internal and external signal transmission of the electronic device 500A.

FIGS. 2A, 2B, 2C, 2D, 2E, 2F, 2G, 2H and 2I are schematic layouts at levels L1, L2, L3, LA, L5, L6, L7, L8 and LN of a portion of the substrate 200 at the device-attach region of the semiconductor device 302, showing the arrangement of the interconnect structure 250 and ground layers GL1, GL2, GL3, GL4, GL5, GL6, GL7, GL8 and GLN of the electronic device 500A. The schematic layouts at levels L1, L2, L3, L4, L5, L6, L7, L8 and LN of another portion of the substrate 200 at the device-attach region of the semiconductor device 332 are mirror-symmetric to the schematic layouts of FIGS. 2A, 2B, 2C, 2D, 2E, 2F, 2G, 2H and 2I. In some embodiments, the interconnect structure 250 of the semiconductor devices 302 and 332 is used for signal and power transmission between the different semiconductor devices 302 and 332 of the same electronic device 500A. For illustration, edges of the semiconductor device 302 are illustrated using dotted lines as shown in FIGS. 2A, 2B, 2C, 2D, 2E, 2F, 2G, 2H and 2I.

As shown in FIGS. 1 and 2A to 2I, the semiconductor device 302 may have a rectangular plan-view shape. The semiconductor devices 302 and 332 may have the same or similar plan-view shapes. The semiconductor device 302 may have opposite edges 302E1 and 302E3 extending substantially along the direction D2 and opposite edges 302E2 and 302E4 substantially along the direction D1. The semiconductor device 332 may have opposite edges 332E1 and 332E3 extending substantially along the direction D2 and other opposite edges (not shown) substantially along the direction D1. The edge 302E1 of the semiconductor device 302 connected between (or adjacent to) the edges 302E2 and 302E4 is beside and adjacent to the edge 332E1 of the semiconductor device 332. The edge 302E3 of the semiconductor device 302 connected between (or adjacent to) the edges 302E2 and 302E4 is away from the edge 332E1 of the semiconductor device 332. The opposite edges 302E2 and 302E4 of the semiconductor device 302 are beside and close to the other opposite edges of the semiconductor die 332, respectively.

Figure 2A:
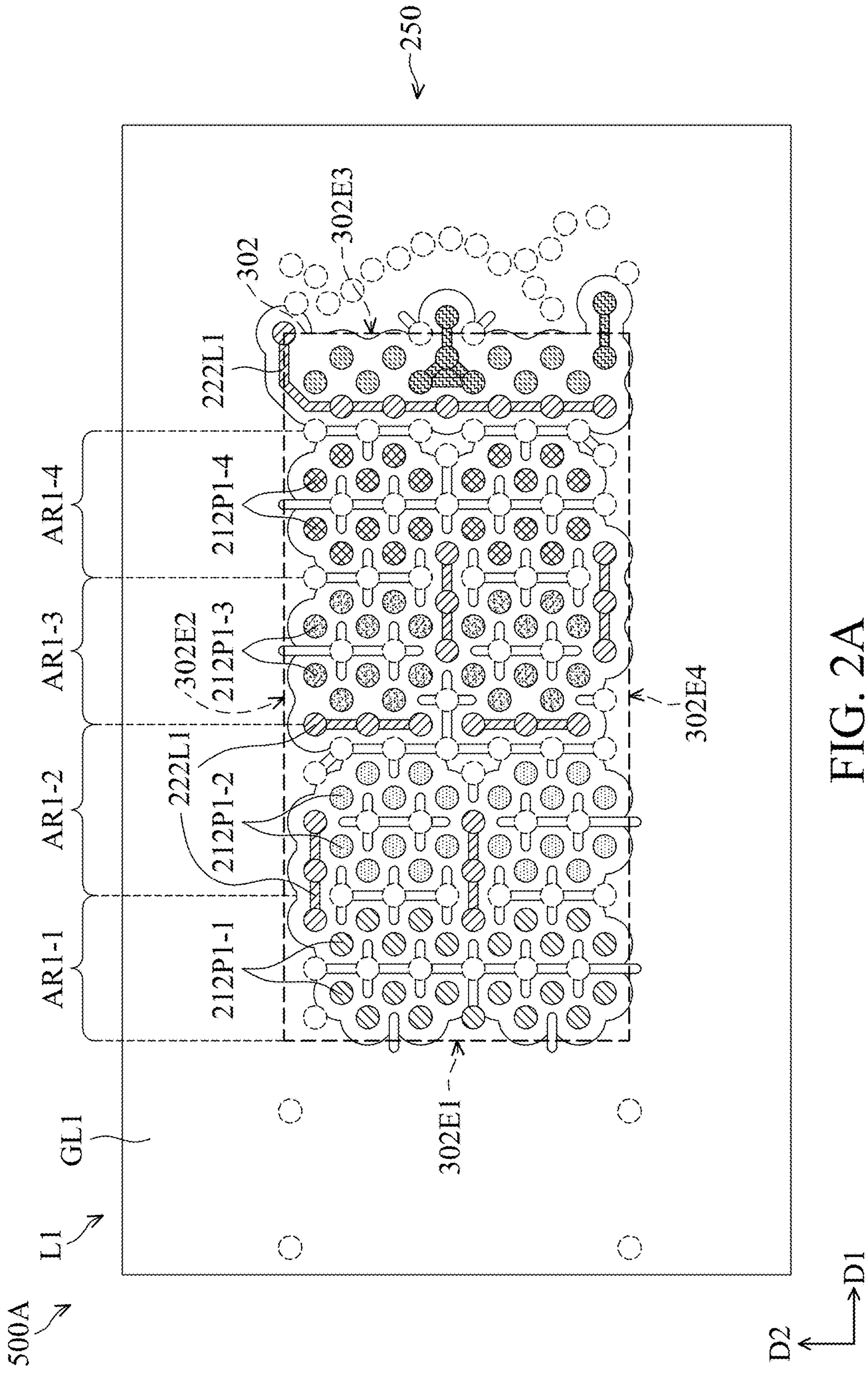
FIGS. 2A, 2B, 2C, 2D, 2E, 2F, 2G, 2H and 2I are schematic layouts at the first level to the eighth level and the $N^{th}$ level of a substrate of an electronic device at the device-attach region of a semiconductor device, showing the arrangement of an interconnect structure and ground layers of an electronic device used in the Universal Chiplet Interconnect Express (UCIe) standard in accordance with some embodiments of the disclosure.

Please refer to FIGS. 1 and 2A, the interconnect structure 250 includes pad regions AR1-1, AR1-2, AR1-3 and AR1-4 for signal pads and power pads disposed within. The pad regions AR1-1, AR1-2, AR1-3 and AR1-4 are arranged side-by-side in the direction D1 and covered by the semiconductor device 300. More specifically, the pad regions AR1-1, AR1-2, AR1-3 and AR1-4 are sequentially arranged from a position close to the edge 302E1 to another position close to the edge 302E3 of the semiconductor device 302. For example, the pad region AR1-1 is arranged so that it is closer to the corresponding edge 302E1 of the semiconductor device 302 than the second pad region AR1-2 along the direction D1. In addition, the pad region AR1-2 is arranged so that it is closer to the corresponding edge 302E1 of the semiconductor device 302 than the pad region AR1-3. Moreover, the pad region AR1-3 is arranged so that it is closer to the corresponding edge 302E1 of the semiconductor device 302 than the pad region AR1-4. It is noted that the electronic device 500A may include other pad regions for other signal pads and power pads disposed within and located beside the pad region AR1-4 and opposite the pad region AR1-3.

In some embodiments, the interconnect structure 250 includes pads 212P1-1, 212P1-2, 212P1-3 and 212P1-4 arranged at level L1 and in the pad regions AR1-1, AR1-2, AR1-3 and AR1-4. The pads 212P1-1, 212P1-2, 212P1-3 and 212P1-4 are covered by and electrically connected to the semiconductor device 302. The pads 212P1-1, 212P1-2, 212P1-3 and 212P1-4 are used for the semiconductor device 302 that is mounted directly on them for transmitting different types of signals between the semiconductor devices 302 and 332. Therefore, the pads 212P1-1, 212P1-2, 212P1-3 and 212P1-4 may serve as the signal pads 212P1-1, 212P1-2, 212P1-3 and 212P1-4.

In some embodiments, the interconnect structure 250 may include signal traces 220L2, 220L4, 220L6 and 220L8 for transmitting signals of a first bandwidth (e.g., the mainland signals). According to the Universal Chiplet Interconnect Express (UCIe) standard, the pads 212P1-1 in the pad region AR1-1 closet to the edge 302E1 of the semiconductor device 302 may be electrically connected to the semiconductor device 332 by the signal traces 220L2 at level L2. The pads 212P1-2 in the pad region AR1-2 adjacent to the pad region AR1-1 may be electrically connected to the semiconductor device 332 by the signal traces 220LA at level LA. The pads 212P1-3 in the pad region AR1-3 adjacent to the pad region AR1-2 may be electrically connected to the semiconductor device 332 by the signal traces 220L6 at level L6. The pads 212P1-4 in the pad region AR1-4 adjacent to the pad region AR1-3 may be electrically connected to the semiconductor device 332 by the signal traces 220L8 at level L8.

Figure 2B:
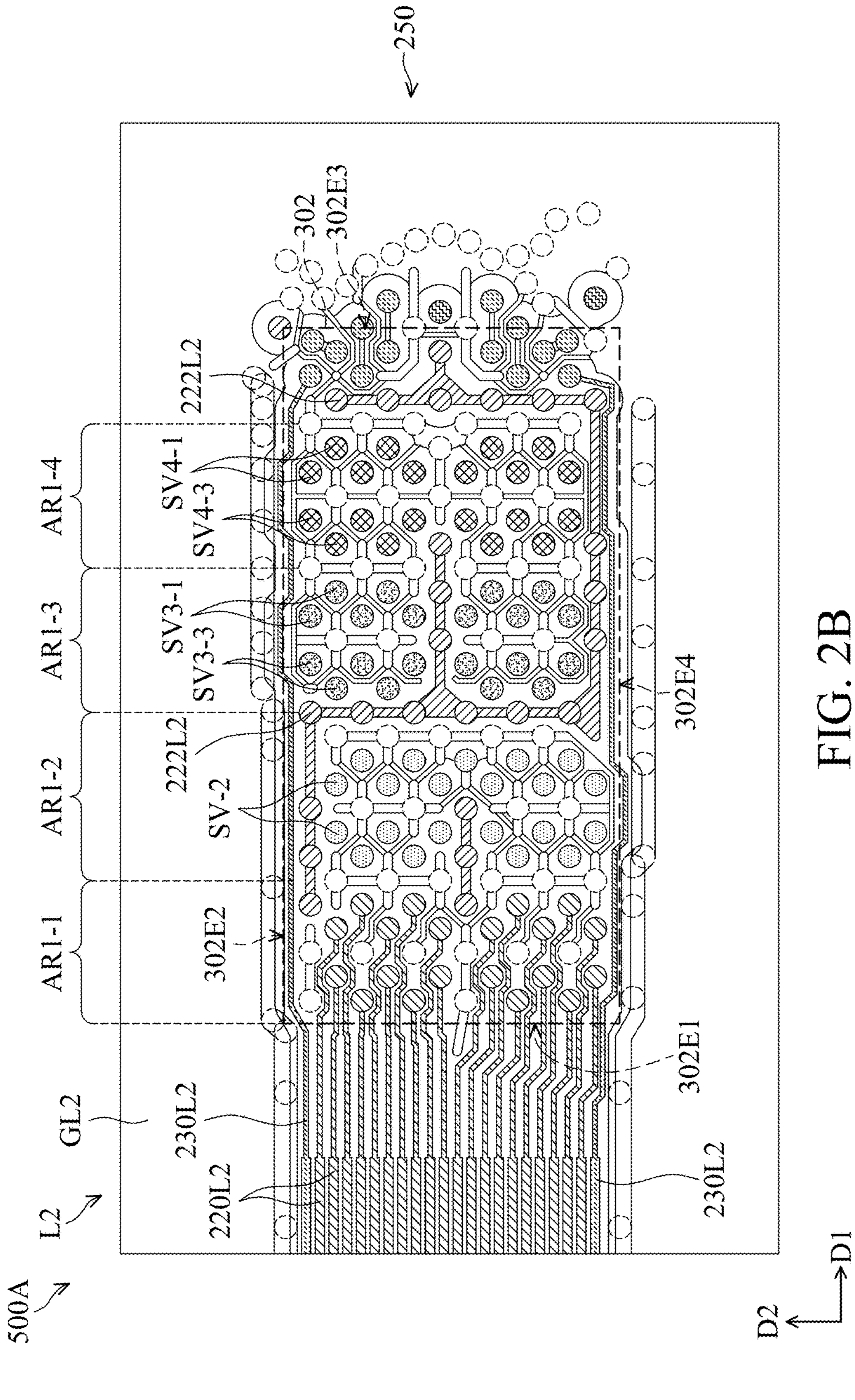
Figure 2C:
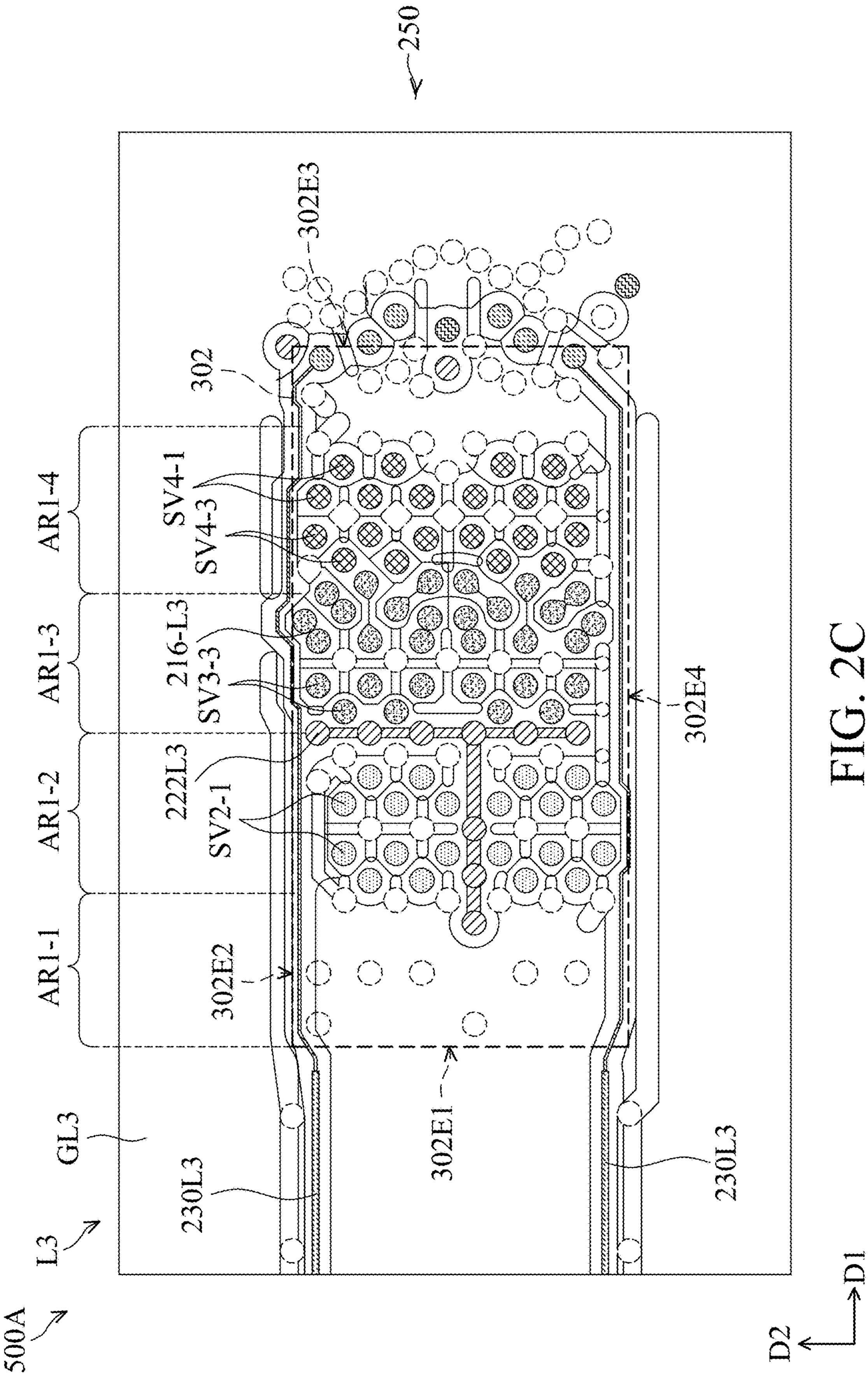
Figure 2D:
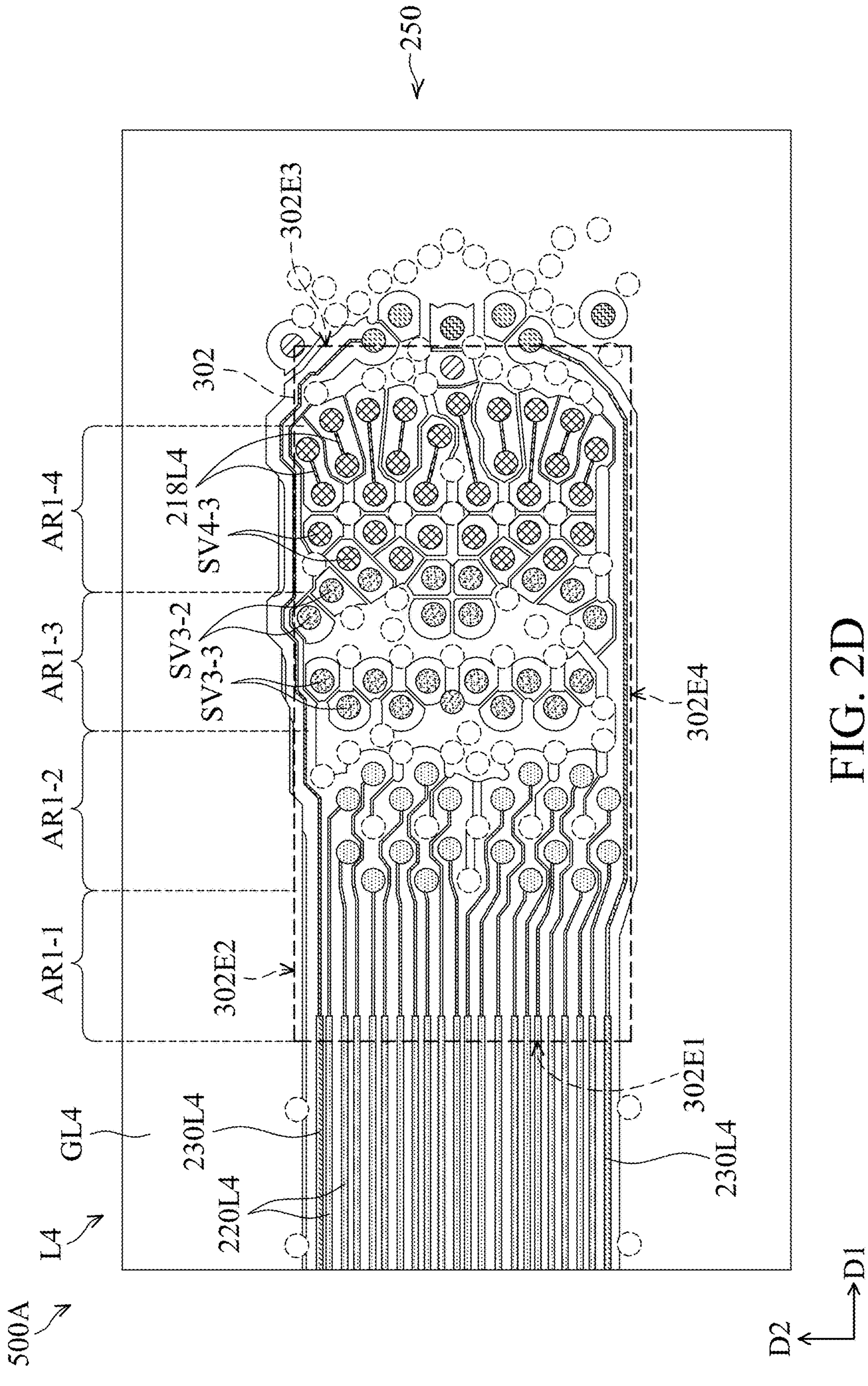
Figure 2E:
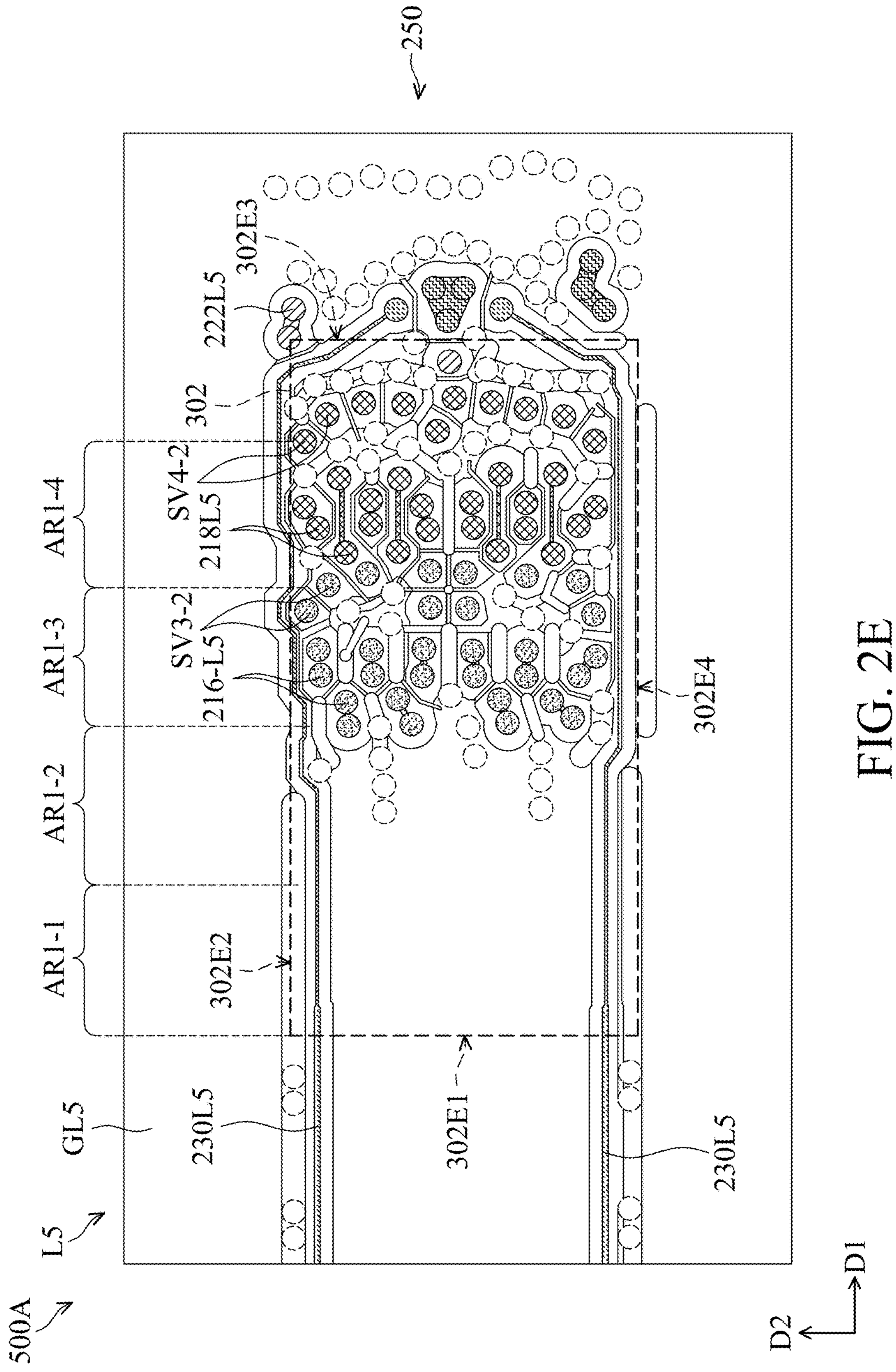
Figure 2F:
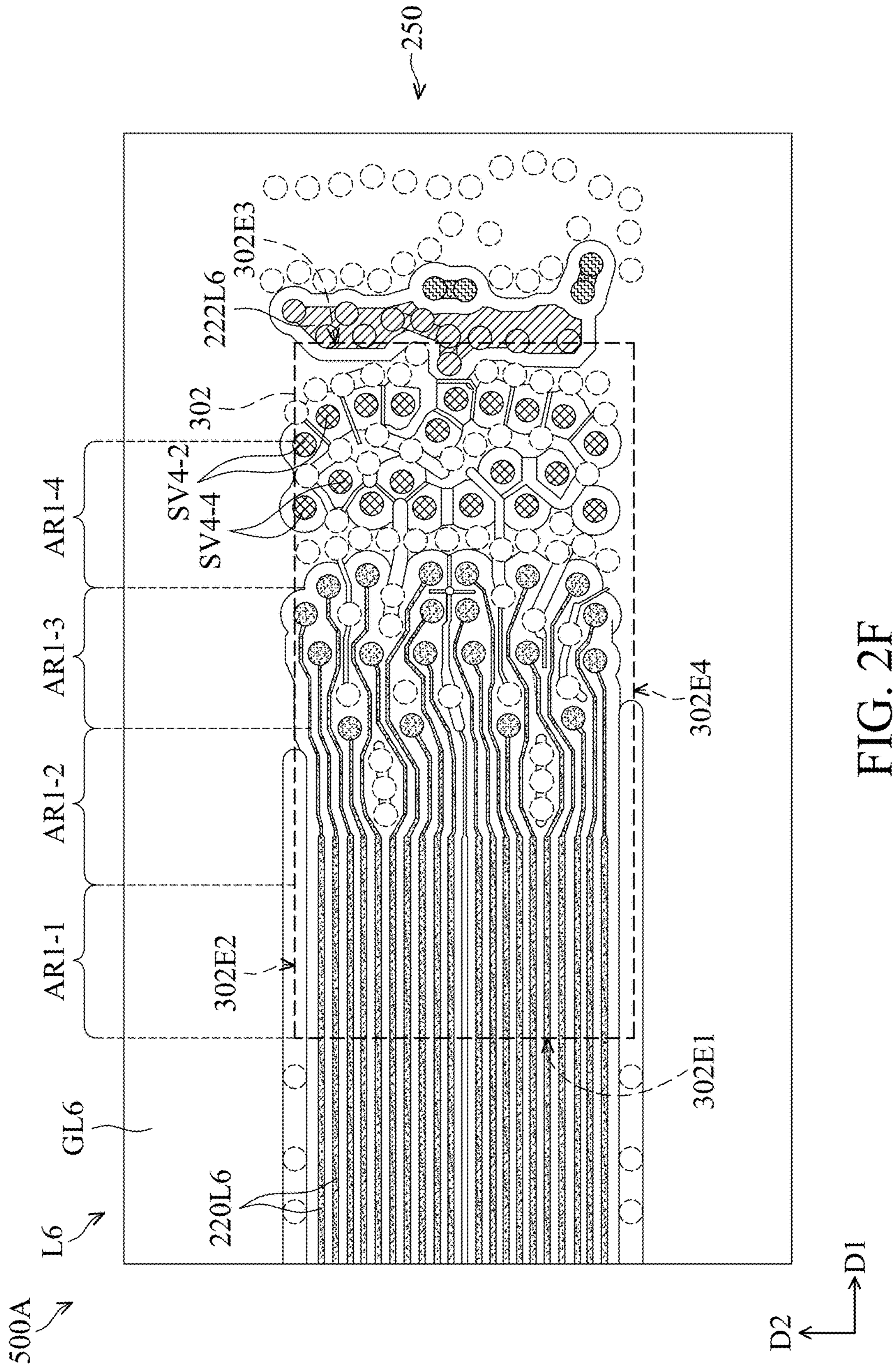
Figure 2G:
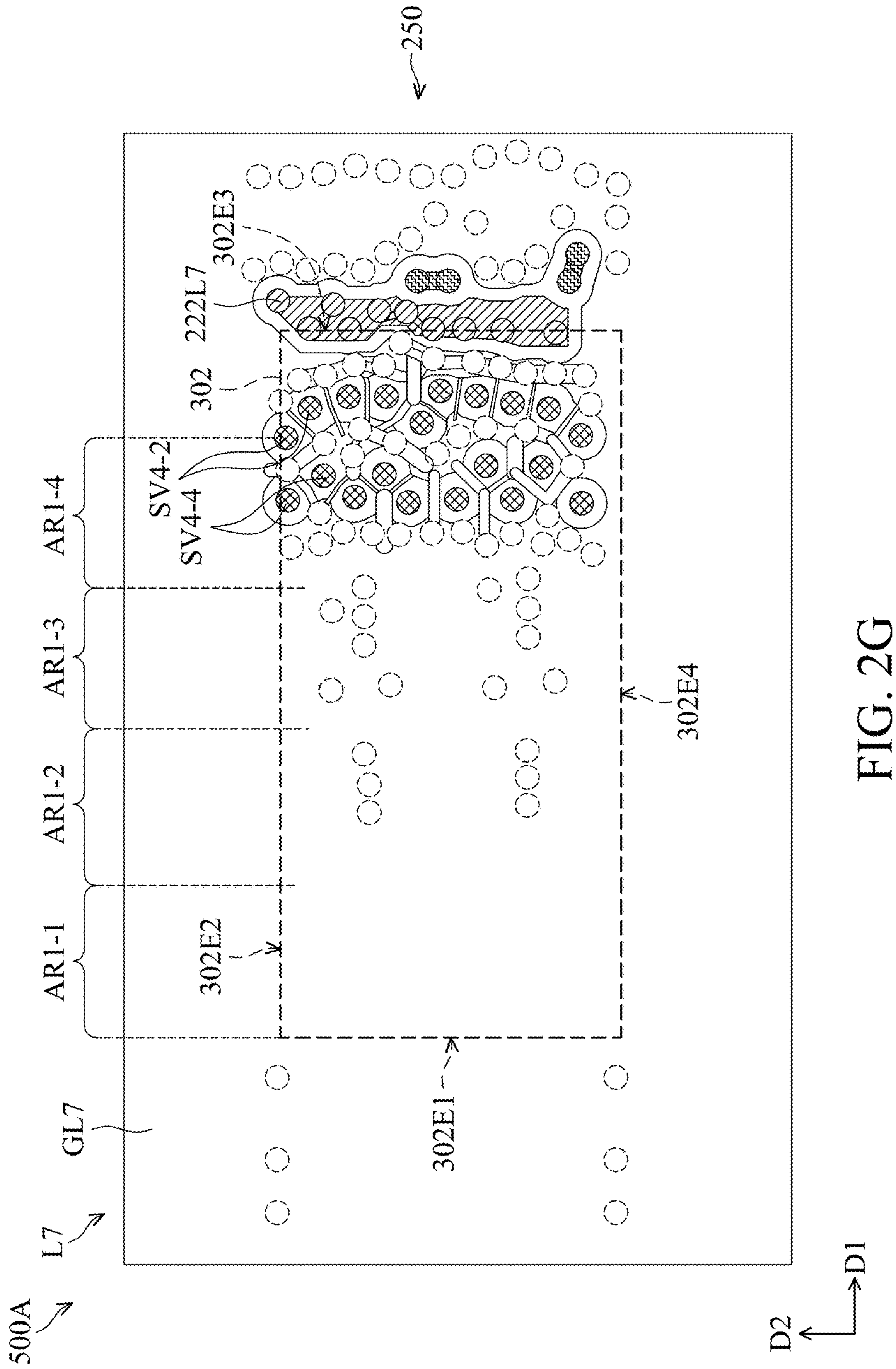
Figure 2H:
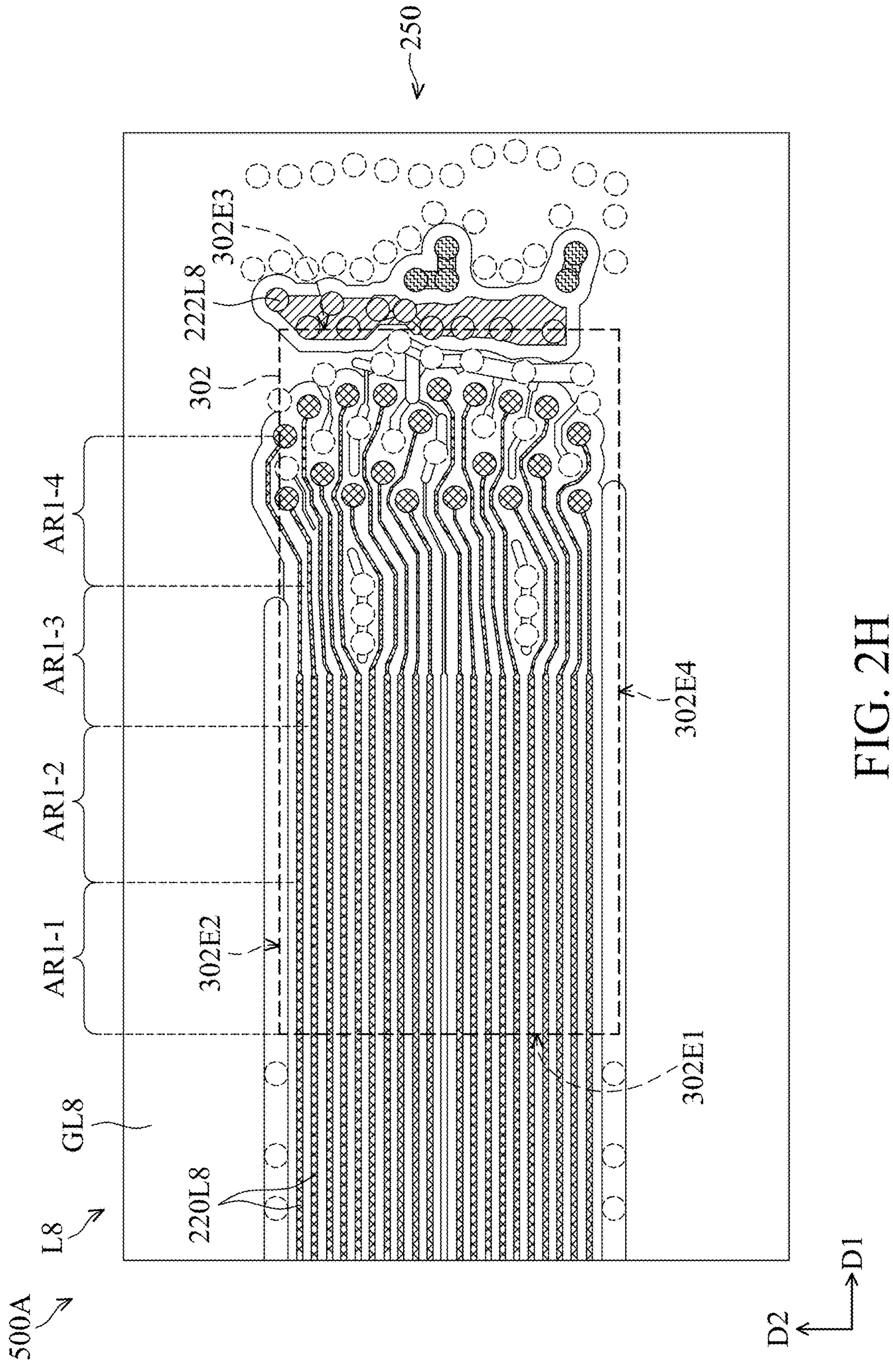

Please refer to FIGS. 1 and 2B, the signal traces 220L2 are disposed at level L2. The signal traces 220L2 may extend in the direction D1 and partially covered by the semiconductor devices 302 and 332. More specifically, opposite terminals TL2-1, TL2-2 of each of the signal traces 220L2 are covered by the semiconductor devices 302 and 332 in the direction D3. In some embodiments, the interconnect structure 250 may further includes via structures SV1-1 extending between levels L1 and L2 of the substrate 200 and covered by the semiconductor device 302. Each of the via structures SV1-1 is composed of a first number of vias vertically (in the direction D3) stacked each other. Each of the via structures SV1-1 are directly connected between the corresponding pad 212P1-1 and the terminal TL2-1 of the corresponding signal trace 220L2. In some embodiments, the first number is a positive integer of 1.

Moreover, the pads 212P1-1 in the pad region AR1-1 closet to the edge 302E1 of the semiconductor device 302 may be electrically connected to the corresponding pads 212P2-1 in the pad region AR2-1 closet to the edge 332E1 of the semiconductor device 332 by via structures SV1-2 and the signal traces 220L2. The via structures SV1-2 are mirror-symmetric to the via structures SV1-1.

Please refer to FIGS. 1 and 2A-2D, the signal traces 220L4 are disposed at level L4. The signal traces 220L4 may extend in the direction D1 and partially covered by the semiconductor devices 302 and 332. More specifically, opposite terminals TL4-1, TL4-2 of each of the signal traces 220L4 are covered by the semiconductor devices 302 and 332 in the direction D3. In some embodiments, the interconnect structure 250 may further includes via structures SV2-1 extending between levels L1 and LA of the substrate 200 and covered by the semiconductor device 302. Each of the via structures SV2-1 is composed of a second number of vias vertically (in the direction D3) stacked each other. In addition, each of the via structures SV2-1 is directly connected between the corresponding pad 212P1-2 and the terminal TL4-1 of the corresponding signal trace 220L4. In some embodiments, the second number is a positive integer between 1 and 3 (depending on the level where the signal traces 216LA are located). For example, the second number is 3.

Moreover, the pads 212P1-2 in the pad region AR1-2 covered by the semiconductor device 302 may be electrically connected to the corresponding pads 212P2-2 in the pad region AR2-2 covered by the semiconductor device 332 by the via structures SV2-2 and the signal traces 220L4. The via structures SV2-2 are mirror-symmetric to the via structures SV2-1.

Please refer to FIGS. 1 and 2A-2F, the signal traces 220L6 disposed at level L6. The signal traces 220L6 may extend in the direction D1 and partially covered by the semiconductor devices 302 and 332. More specifically, opposite terminals TL6-1, TL6-2 of each of the signal traces 220L6 are covered by the semiconductor devices 302 and 332 in the direction D3.

In some embodiments, the interconnect structure 250 may further include additional signal traces (segments) disposed vertically (in the direction D3) between the pads 212P1-3 in the pad region AR1-3 at level L1 and the signal traces 220L6 at level L6. Therefore, the conventional single via structure composed of 5 stacked vias and used to connected between the pad region AR1-3 and the signal traces 220L6 may be "cut-off" by the additional signal trace and divided into several misaligned via structures composed of less than 5 stacked vias. The misaligned via structures are directly connected between the first terminal of the additional signal trace and the corresponding pad 212P1-3, and between the second terminal of the additional signal trace and the signal traces 220L6. In addition, the misaligned via structures have a reduced number of stacked vias (less than 5) and are surrounded by the corresponding ground layers to ensure the SI/PI performance. The misaligned via structures have advantages of reduced fabrication cost and lower manufacturing processing requirements.

In some embodiments, the interconnect structure 250 may further include signal traces (segments) 216L3 (or signal traces (segments) 216L5) and via structures SV3-1, SV3-2 (or via structures SV3-3, SV3-4) disposed directly below the pads 212P1-3 in the pad region AR1-3 and connected between the pads 212P1-3 and the signal traces 220L6. The signal trace 220L6 is located below the pads 212P1-3 and the signal traces (segments) 216L3 (or the signal traces (segments) 216L5) in the direction D3. In some embodiments, the length of the signal trace 216L3 is much shorter than the length of the signal trace 220L6 in the direction D1.

As shown in FIGS. 1 and 2A-2F, for example, some of the pads 212P1-3 may be electrically connected to the signal trace 220L6 by the signal traces (segments) 216L3 and the via structures SV3-1, SV3-2. The signal traces 216L3 are arranged at level L3 of the substrate 200 and have opposite terminals TL3-1 and TL3-2. The signal traces 216L3 are disposed directly below the pads 212P1-3 in the pad region AR1-3 and fully covered by the semiconductor device 302. The via structures SV3-1, SV3-2 are covered by the semiconductor device 302. In addition, each of the via structures SV3-1 extends between levels L1 and L3 of the substrate 200 and is composed of a third number of vias vertically (in the direction D3) stacked each other. Each of the via structures SV3-1 is directly connected between the corresponding pad 212P1-3 and the terminal TL3-1 of the corresponding signal trace 216L3. Moreover, each of the via structures SV3-2 extends between levels L3 and L6 of the substrate 200 and is composed of a fourth number of vias vertically (in the direction D3) stacked each other. Each of the via structures SV3-2 is directly connected between the terminal TL3-2 of the corresponding signal trace 216L3 and the terminal TL6-1 of the signal traces 220L6.

Since the opposite terminals TL3-1, TL3-2 of the signal trace 216L3 are connected to the corresponding via structure SV3-1 and the corresponding via structure SV3-2, the via structure SV3-1 and the via structure SV3-2 connected to the same signal trace 216L3 are misaligned with each other in the direction D3.

In some embodiments, the third number and the fourth number are both positive integers between 1 and 4 (less than 5). The sum of the third number and the fourth number is 5 (depending on the level where the signal traces 220L6 are located). For example, the third number is 2 and the fourth number is 3.

Moreover, the pads 212P1-3 in the pad region AR1-3 covered by the semiconductor device 302 may be electrically connected to the corresponding pads 212P2-3 in the pad region AR2-3 covered by the semiconductor device 332 by the signal traces (segments) 217L3, via structures SV3-5, SV3-6 and the signal trace 220L6. The signal traces 217L3 are mirror-symmetric to the signal traces 216L3. The via structures SV3-5, SV3-6 are mirror-symmetric to the via structures SV3-1, SV3-2.

As shown in FIGS. 1 and 2A-2F, for example, some other of the pads 212P1-3 may be electrically connected to the signal trace 220L6 by the signal traces (segments) 216L5 and the via structures SV3-3, SV3-4. The signal traces 216L5 are arranged at level L5 of the substrate 200 and have opposite terminals TL5-1 and TL5-2. The signal traces 216L5 are disposed directly below the pads 212P1-3 in the pad region AR1-3 and fully covered by the semiconductor device 302. In addition, each of the via structures SV3-3 extends between levels L1 and L5 of the substrate 200 and is composed of a fifth number of vias vertically (in the direction D3) stacked each other. Each of the via structures SV3-3 is directly connected between the corresponding pad 212P1-3 and the terminal TL5-1 of the corresponding signal trace 216L5. Moreover, each of the via structures SV3-4 extends between levels L5 and L6 of the substrate 200 and is composed of a fifth number of vias vertically (in the direction D3) stacked each other. Each of the via structures SV3-4 is directly connected between the terminal TL5-2 of the corresponding signal trace 216L5 and the terminal TL6-1 of the signal traces 220L6.

In some embodiments, the fifth number and the sixth number are both positive integers between 1 and 4 (less than 5). The sum of the fifth number and the sixth number is 5 (depending on the level where the signal traces 220L6 are located). For example, the fifth number is 4 and the sixth number is 1. In other words, the via structure SV3-4 is a single via and its structure is the same or similar to the via V1.

Moreover, the pads 212P1-3 in the pad region AR1-3 covered by the semiconductor device 302 may be electrically connected to the corresponding pads 212P2-3 in the pad region AR2-3 covered by the semiconductor device 332 by the signal traces (segments) 217L5, the via structures SV3-7, SV3-8 and the signal trace 220L6. The signal traces 217L5 are mirror-symmetric to the signal traces 216L5. The via structures SV3-7, SV3-8 are mirror-symmetric to the via structures SV3-7, SV3-8.

Since the opposite terminals TL5-1, TL5-2 of the signal trace 216L5 are connected to the corresponding via structure SV3-3 and the corresponding via structure SV3-4, the via structure SV3-3 and the via structure SV3-4 connected to the same signal trace 216L5 are misaligned with each other in the direction D3. Similarly, the via structure SV3-7 and the via structure SV3-8 connected to the same signal trace 217L5 are misaligned with each other in the direction D3.

According to the limitation of the number of vias used to form the via structures, the electronic device 500A may further include additional signal traces (segments) disposed at level LA and vertically (in the direction D3) between the pads 212P1-3 in the pad region AR1-3 (or the pads 212P2-3 in the pad region AR2-3) at level L1 and the signal traces 220L6 at level L6.

Please refer to FIGS. 1 and 2A-2H, the signal traces 220L8 disposed at level L8. The signal traces 220L8 may extend in the direction D1 and partially covered by the semiconductor devices 302 and 332. More specifically, opposite terminals TL8-1, TL8-2 of each of the signal traces 220L8 are covered by the semiconductor devices 302 and 332 in the direction D3.

In some embodiments, the interconnect structure 250 may further include additional signal traces (segments) disposed vertically (in the direction D3) between the pads 212P1-4 in the pad region AR1-4 at level L1 and the signal traces 220L8 at level L8. Therefore, the conventional single via structure composed of 7 stacked vias used to connected between the pad region AR1-4 and the signal traces 220L8 may be "cut-off" by the additional signal trace and divided into several misaligned via structures composed of less than 5 stacked vias. The misaligned via structures are directly connected between the first terminal of the additional signal trace and the corresponding pad 212P1-4, and between the second terminal of the additional signal trace and the signal traces 220L8. In addition, the misaligned via structures have a reduced number of stacked vias (less than 5) and are surrounded by the corresponding ground layers to ensure the SI/PI performance. The misaligned via structures have advantages of reduced fabrication cost and lower manufacturing processing requirements.

In some embodiments, the interconnect structure 250 may further include signal traces (segments) 218L4 (or signal traces (segments) 218L5) and via structures SV4-1, SV4-2 (or via structures SV4-3, SV4-4) disposed directly below the pads 212P1-4 in the pad region AR1-4 and connected between the pads 212P1-4 and the signal traces 220L8. The signal trace 220L8 is located below the pads 212P1-4 and the signal traces (segments) 218L4 (or the signal traces (segments) 218L5) in the direction D3. In some embodiments, the length of the signal trace 218L4 is much shorter than the length of the signal trace 220L8 in the direction D1.

As shown in FIGS. 1 and 2A-2H, for example, some of the pads 212P1-4 may be electrically connected to the signal trace 220L8 by the signal traces (segments) 218L4 and the via structures SV4-1, SV4-2. The signal traces 218L4 are arranged at level L4 of the substrate 200 and have opposite terminals TL4-3 and TL4-4. The signal traces 218L4 are disposed directly below the pads 212P1-4 in the pad region AR1-4 and fully covered by the semiconductor device 302. In addition, each of the via structures SV4-1 extends between levels L1 and LA of the substrate 200 and is composed of a seventh number of vias vertically (in the direction D3) stacked each other. Each of the via structures SV4-1 is directly connected between the corresponding pad 212P1-4 and the terminal TLA-3 of the corresponding signal trace 218L4. Moreover, each of the via structures SV4-2 extends between levels LA and L8 of the substrate 200 and is composed of a eighth number of vias vertically (in the direction D3) stacked each other. Each of the via structures SV4-2 is directly connected between the terminal TL4-4 of the corresponding signal trace 218L4 and the terminal TL8-1 of the signal traces 220L8.

In some embodiments, the seventh number and the eighth number are both positive integers between 1 and 4 (less than 5). The sum of the seventh number and the eighth number is 7 (depending on the level where the signal traces 220L8 are located). For example, the seventh number is 3 and the third number is 4.

Moreover, the pads 212P1-4 in the pad region AR1-4 covered by the semiconductor device 302 may be electrically connected to the corresponding pads 212P2-4 in the pad region AR2-4 covered by the semiconductor device 332 by the signal traces (segments) 219L4, the via structures SV4-5, SV4-6 and the signal trace 220L8. The signal traces 219L4 are mirror-symmetric to the signal traces 218L4. The via structures SV4-5, SV4-6 are mirror-symmetric to the via structures SV4-1, SV4-2.

Since the opposite terminals TL4-3, TLA-4 of the signal trace 218L4 are connected to the corresponding via structure SV4-1 and the corresponding via structure SV4-2, the via structure SV4-1 and the via structure SV4-2 connected to the same signal trace 218L4 are misaligned with each other in the direction D3. Similarly, the via structure SV4-5 and the via structure SV4-6 connected to the same signal trace 219L4 are misaligned with each other in the direction D3.

As shown in FIGS. 1 and 2A-2H, for example, some other of the pads 212P1-4 may be electrically connected to the signal trace 220L8 by the signal traces (segments) 218L5 and the via structures SV4-3, SV4-4. The signal traces 218L5 are arranged at level L5 of the substrate 200 and have opposite terminals TL5-3 and TL5-4. The signal traces 218L5 are disposed directly below the pads 212P1-4 in the pad region AR1-4 and fully covered by the semiconductor device 302. In addition, each of the via structures SV4-3 extends between levels L1 and L5 of the substrate 200 and is composed of a ninth number of vias vertically (in the direction D3) stacked each other. Each of the via structures SV4-3 is directly connected between the corresponding pad 212P1-4 and the terminal TL5-3 of the corresponding signal trace 218L5. Moreover, each of the via structures SV4-4 extends between levels L5 and L8 of the substrate 200 and is composed of a tenth number of vias vertically (in the direction D3) stacked each other. Each of the via structures SV4-4 is directly connected between the terminal TL5-4 of the corresponding signal trace 218L5 and the terminal TL8-1 of the signal traces 220L8. In some embodiments, the ninth number and the tenth number are both positive integers between 1 and 4 (less than 5). The sum of the ninth number and the tenth number is 7 (depending on the level where the signal traces 220L8 are located). For example, the ninth number is 4 and the tenth number is 3.

Moreover, the pads 212P1-4 in the pad region AR1-4 covered by the semiconductor device 302 may be electrically connected to the corresponding pads 212P2-4 in the pad region AR2-4 covered by the semiconductor device 332 by the signal traces (segments) 219L5 and the via structures SV4-7, SV4-8 and the signal trace 220L8. The signal traces 219L5 are mirror-symmetric to the signal traces 218L5. The via structures SV4-7, SV4-8 are mirror-symmetric to the via structures SV4-3, SV4-4.

Since the opposite terminals TL5-3, TL5-4 of the signal trace 218L5 are connected to the corresponding via structure SV4-3 and the corresponding via structure SV4-4, the via structure SV4-3 and the via structure SV4-3 connected to the same signal trace 218L5 are misaligned with each other in the direction D3. Similarly, the via structure SV4-7 and the via structure SV4-8 connected to the same signal trace 219L5 are misaligned with each other in the direction D3.

Due to the limitation of the number of stacked vias used to form the via structures, the additional signal traces (segments) are not allowed to by disposed at level L6 or L7 and vertically (in the direction D3) between the pads 212P1-4 in the pad region AR1-4 (or the pads 212P2-4 in the pad region AR2-4) at level L1 and the signal traces 220L8 at level L8.

In some embodiments, the interconnect structure 250 may further include signal traces 230L2, 230L3, 230L4 and 230L5 overlapping each other and transmitting signals of a second bandwidth (e.g., the sideband signals) that is different form the first bandwidth. For example, the second bandwidth is lower than the first bandwidth. Therefore, the signal traces 230L2, 230L3, 230L4 and 230L5 may also serve as sideband signal traces 230L2, 230L3, 230LA and 230L5. In some embodiments, the signal traces 230L2, 230L3, 230LA and 230L5 arranged along the opposite edges 302E2 and 302E4 and partially covered by the semiconductor device 302 and semiconductor device 332. The sideband signal traces 230L2, 230L3, 230L4 and 230L5 substantially parallel to the mainland signal traces 220L2, 220LA, 220L6 and 220L8. In some embodiments, the signal traces 230L2, 230L3, 230L4 and 230L5 are arranged at four adjacent levels (such as levels L2, L3, L4 and L5) of the substrate 200 and connected to each other by the vias (not shown) in order to conform with the Universal Chiplet Interconnect Express (UCIe) standard. For example, there are two signal traces 230L2 at level L2 arranged along the opposite edges 302E2 and 302E4 and extending substantially along the direction D1, so that the signal traces 220L2, the power traces 222L2 and the via structures SV1-1, SV2-1, SV3-1, SV3-3, SV4-1, SV4-3, SV1-2, SV2-2, SV3-5, SV3-7, SV4-5, SV4-7 are sandwiched between the signal traces 230L. There are two signal traces 230L3 at level L3 arranged along the opposite edges 302E2 and 302E4 and extending substantially along the direction D1, so that the signal traces 216L3, 217L3, the power traces 222L3 and the via structures SV2-1, SV3-3, SV4-1, SV4-3, SV2-2, SV3-7, SV4-5, SV4-7 are sandwiched between the signal traces 230L3. There are two signal traces 230L4 at level LA arranged along the opposite edges 302E2 and 302E4 and extending substantially along the direction D1, so that the signal traces 218L4, 219L4, 220L4 and the via structures SV3-2, SV3-3, SV4-3, SV3-6, SV3-7, SV4-7 are sandwiched between the signal traces 230L4. There are two signal traces 230L5 at level L5 arranged along the opposite edges 302E2 and 302E4 and extending substantially along the direction D1, so that the signal traces 216L5, 217L5, 218L5, 219L5, the power traces 222L5 and the via structures SV3-2, SV4-2, SV3-6, SV4-6 are sandwiched between the signal traces 230LA. It is noted that the sideband signal traces 230L2, 230L3, 230L4 and 230L5 of the electronic device 500A are not arranged at the lower levels of the substrate 200, such as levels L6 to L8. Therefore, the substrate 200 may have better return paths for the signal traces located at the deeper levels of the substrate 200 (such as the signal traces 220L6 at level L6 and the signal traces 220L8 at level L8 of the substrate 200). Therefore, the signal and power integrity (SI/PI) problems of the signal traces located at the deeper levels of the substrate 200 can be improved.

In some embodiments, the interconnect structure 250 may further include power traces 222L1, 222L2, 222L3, 222L5, 222L6, 222L7, 222L8, . . . , 222LN and power pads 224P arranged in the pad regions AR1-1, AR1-2, AR1-3 and AR1-4. The power traces 222L1, 222L2, 222L3, 222L5, 222L6, 222L7, 222L8, . . . , 222LN and the power pads 224P are connected each other by the vias and/or the via structure (not shown).

In some embodiments, the substrate 200 includes ground layers GL1 to GLN located at levels L1 to LN. The ground layers GL1 to GLN are connected each other by the via (not shown). For example, the ground layer GL1 at level L1 is separated from and surrounds the pads 212P1-1, 212P1-2, 212P1-3 and 212P1-4 and the power traces 222L1. The ground layer GL2 at level L2 is separated from and surrounds the signal traces 220L2, the power traces 222L2 and the via structures SV2-1, SV3-1, SV3-3, SV4-1, SV4-3 (and the via structures SV2-2, SV3-5, SV3-7, SV4-5, SV4-7). The ground layer GL3 at level L3 is separated from and surrounds the signal traces 216L3, the power traces 222L3 and the via structures SV2-1, SV3-3, SV4-1, SV4-3 (and the signal traces 217L3, the via structures SV2-2, SV3-7, SV4-5, SV4-7). The ground layer GL4 at level LA is separated from and surrounds the signal traces 218L4, 220L4 and the via structures SV3-2, SV3-3, SV4-3 (and the signal traces 219L4, the via structures SV3-6, SV3-7, SV4-7). The ground layer GL5 at level L5 is separated from and surrounds the signal traces 216L5, 218L5, the power traces 222L5 and the via structures SV3-2, SV4-2 (and the signal traces 217L5, 219L5, the via structures SV3-6, SV4-6. The ground layer GL6 at level L6 is separated from and surrounds the signal traces 220L6, the power traces 222L6 and the via structures SV4-2, SV4-4 (and the via structures SV4-6, SV4-8). The ground layer GL7 at level L7 is separated from and surrounds the power traces 222L7 and the via structures SV4-2, SV4-4 (and the via structures SV4-6, SV4-8). The ground layer GL8 at level L8 is separated from and surrounds the signal traces 220L8 and the power traces 222L8. The ground layer GLN at level LN is separated from and surrounds the power pads 224P.

FIGS. 3A, 3B, 3C, 3D, 3E, 3F, 3G and 3H are schematic layouts at levels L1, L2, L3, LA, L5, L6, L7 and L8 of the substrate 200 of an electronic device 500B at the device-attach region of adjacent semiconductor devices 302, 342, showing the arrangement of interconnect structure 250, 450 and the ground layers GL1, GL2, GL3, GL4, GL5, GL6, GL7 and GL8 of the electronic device 500B used in the Universal Chiplet Interconnect Express (UCIe) standard in accordance with some embodiments of the disclosure. Elements of the embodiments hereinafter, that are the same or similar as those previously described with reference to FIGS. 1 and 2A to 2H, are not repeated for brevity.

As shown in FIGS. 3A to 3H, the difference between the electronic device assembly 500A and the electronic device 500B is at least that the electronic device 500B further includes a semiconductor device 342 and an interconnect structure 450 of the substrate 200. The interconnect structure 450 is also used in the Universal Chiplet Interconnect Express (UCIe) standard (also called as an UCIe interconnect structure 450). In addition, the interconnect structures 250 and 450 further include signal traces 430L2, 430L3, 430LA and 430L5 overlapping each other and transmitting signals of a second bandwidth (e.g., the sideband signals). Therefore, the signal traces 430L2, 430L3, 430LA and 430L5 may also serve as sideband signal traces 430L2, 430L3, 430L4 and 430L5. The semiconductor device 342 has the chiplet architecture and is disposed on the top surface 200T of the substrate 200. The semiconductor device 302 and the semiconductor device 342 (also called chiplets 302 and 342) arranged side-by-side along the direction D2 that is different from the extending direction (the direction D1) of the mainland signal traces 220L2, 220LA, 220L6 and 220L8. The semiconductor devices 302, 332 and 342 may have the same or similar plan-view shapes. For example, the semiconductor device 342 may have opposite edges 342E1 and 342E3 extending substantially along the direction D2 and opposite edges 342E2 and 342E4 substantially along the direction D1. The semiconductor device 332 is disposed beside the edge 302E1 of the semiconductor die 302. The semiconductor device 342 is disposed beside the edge 302E4 of the semiconductor die 302. In addition, the edge 342E2 of the semiconductor device 342 is beside the edge 302E4 of the semiconductor die 302. The edge 342E4 of the semiconductor device 342 is away from the semiconductor die 302.

In some embodiments, the interconnect structure 450 extends substantially along the direction D1. The interconnect structure 450 may be electrically connected between the semiconductor device 342 and the semiconductor device 332. Alternatively, the interconnect structure 450 may be electrically connected between the semiconductor device 342 and another semiconductor device located beside the semiconductor device 332 in the direction D2. In some embodiments, the interconnect structure 450 and the interconnect structure 250 may have a structure and arrangement that are the same or similar. For example, the interconnect structure 450 may include pads 412P1-1, 412P1-2, 412P1-3 and 412P1-4 in pad regions AR3-1, AR3-2, AR3-3 and AR3-4 and the power traces 422L1 at level L1 and may be surrounded by the ground layer GL1. The pads 412P1-1, 412P1-2, 412P1-3 and 412P1-4 and the pads 212P1-1, 212P1-2, 212P1-3 and 212P1-4 may have a structure and arrangement that are the same or similar.

The interconnect structure 450 may further include signal traces 420L2 and power traces 422L2 at level L2 and be surrounded by the ground layer GL2. The signal traces 420L2 and the signal traces 220L2 may have a structure and arrangement that are the same or similar. The power traces 422L2 and the power traces 222L2 may have a structure and arrangement that are the same or similar.

The interconnect structure 450 may further include via structures SV1-11 extending between level L1 and level L2. The via structures SV1-11 and the via structures SV1-1 may have a structure and arrangement that are the same or similar.

The interconnect structure 450 may further include the signal traces 416L3 and the power traces 422L3 at level L3 and be surrounded by the ground layer GL3. The signal traces 416L3 and the signal traces 216L3 may have a structure and arrangement that are the same or similar. The power traces 422L3 and the power traces 222L3 may have a structure and arrangement that are the same or similar.

The interconnect structure 450 may further include via structures SV3-11 extending between level L1 and level L3. The via structures SV3-11 and the via structures SV3-1 may have a structure and arrangement that are the same or similar.

The interconnect structure 450 may further include signal traces 418L4, 420LA at level LA and be surrounded by the ground layer GLA. The signal traces 418L4, 420LA and the signal traces 218L4, 220L4 may have a structure and arrangement that are the same or similar.

The interconnect structure 450 may further include via structures SV2-11, SV4-11 extending between level L1 and level LA. The via structures SV2-11, SV4-11 and the via structures SV2-1, SV4-1 may have a structure and arrangement that are the same or similar.

The interconnect structure 450 may further include signal traces 416L5, 418L5 and power traces 422L5 at level L5 and be surrounded by the ground layer GL5. The signal traces 416L5, 418L5 and the signal traces 216L5, 218L5 may have a structure and arrangement that are the same or similar. The power traces 422L5 and the power traces 222L5 may have a structure and arrangement that are the same or similar.

The interconnect structure 450 may further include via structures SV3-13, SV4-13 extending between level L1 and level L5. The via structures SV3-13, SV4-13 and the via structures SV3-3, SV4-3 may have a structure and arrangement that are the same or similar.

The interconnect structure 450 may further include signal traces 420L6 and power traces 422L6 at level L6 and be surrounded by the ground layer GL6. The signal traces 420L6 and the signal traces 220L6 may have a structure and arrangement that are the same or similar. The power traces 422L6 and the power traces 222L6 may have a structure and arrangement that are the same or similar.

The interconnect structure 450 may further include via structures SV3-12 extending between level L3 and level L6. The via structures SV3-12 and the via structures SV3-2 may have a structure and arrangement that are the same or similar. The interconnect structure 450 may further include via structures SV3-14 extending between level L5 and level L6. The via structures SV3-14 and the via structures SV3-4 may have a structure and arrangement that are the same or similar.

The interconnect structure 450 may further include power traces 422L7 at level L7 and be surrounded by the ground layer GL7. The power traces 422L7 and the power traces 222L7 may have a structure and arrangement that are the same or similar.

The interconnect structure 450 may further include signal traces 420L8 and power traces 422L8 at level L8 and be surrounded by the ground layer GL8. The signal traces 420L8 and the signal traces 220L8 may have a structure and arrangement that are the same or similar. The power traces 422L8 and the power traces 222L8 may have a structure and arrangement that are the same or similar.

The interconnect structure 450 may further include via structures SV4-12 extending between level L4 and level L8. The via structures SV4-12 and the via structures SV4-2 may have a structure and arrangement that are the same or similar. The interconnect structure 450 may further include via structures SV4-14 extending between level L5 and level L8. The via structures SV4-14 and the via structures SV4-4 may have a structure and arrangement that are the same or similar.

Figure 2I:
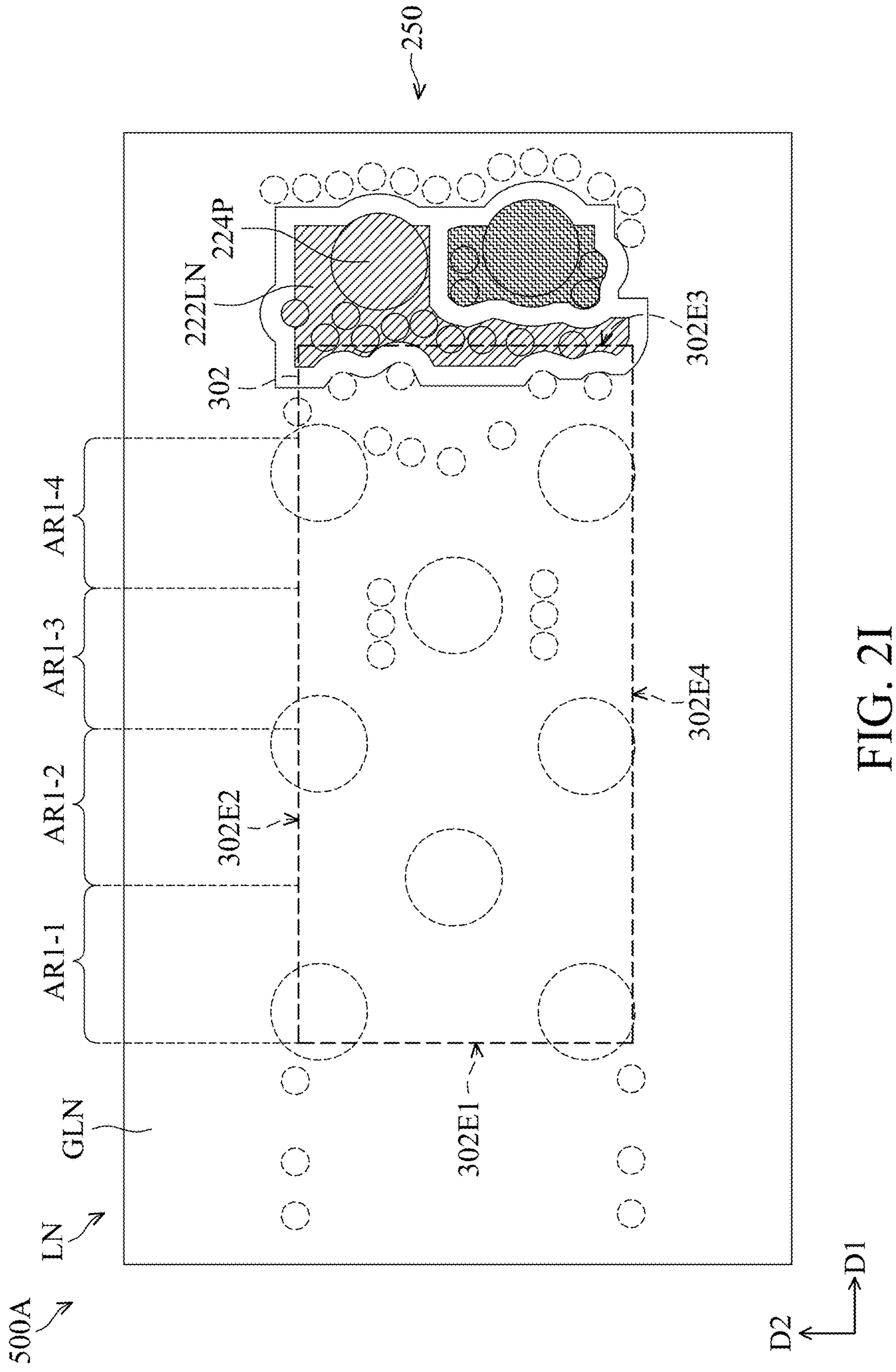
Figure 3A:
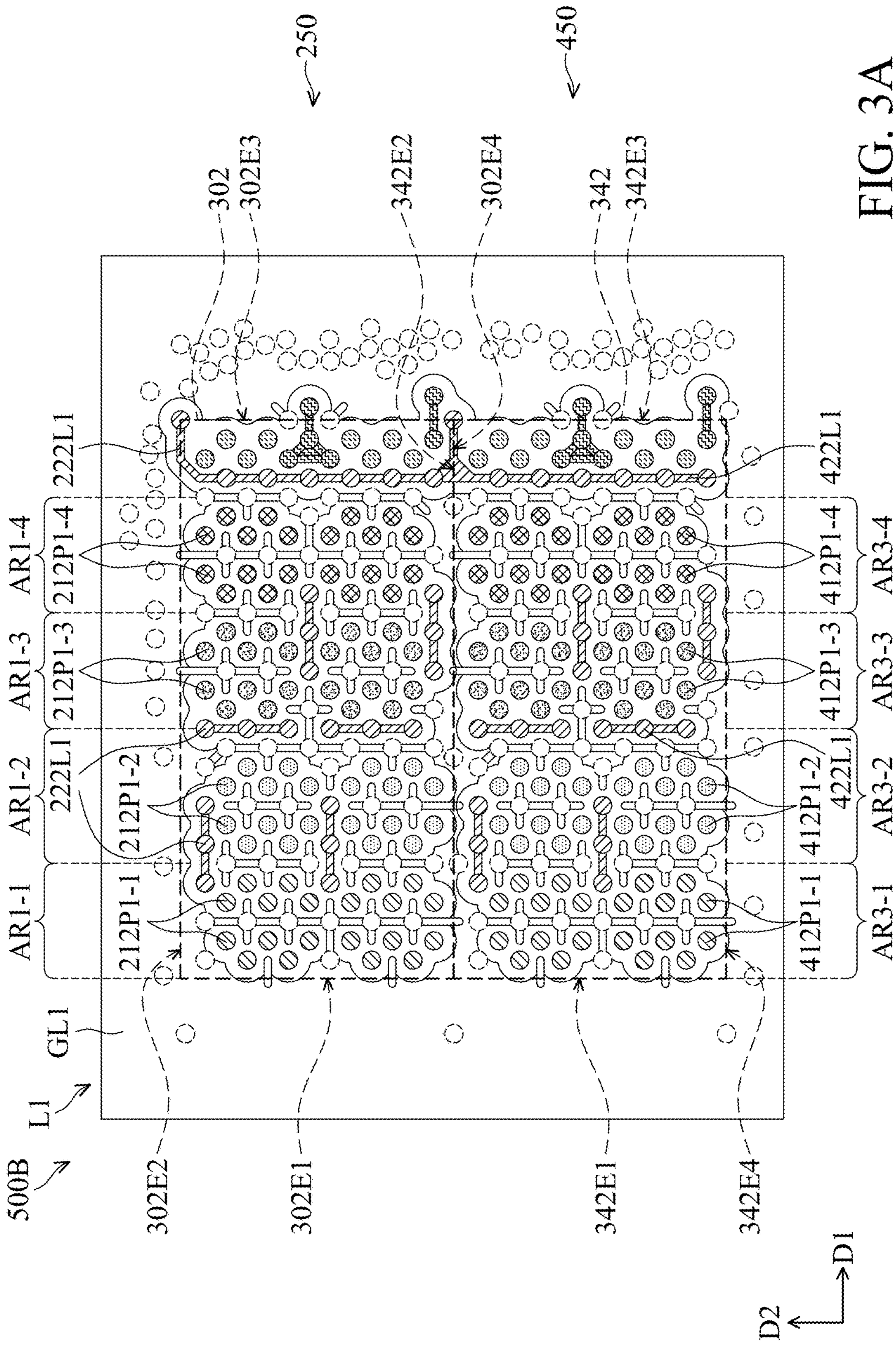
FIGS. 3A, 3B, 3C, 3D, 3E, 3F, 3G and 3H are schematic layouts at the first level to the eighth level of a substrate of an electronic device at the device-attach region of adjacent semiconductor devices, showing the arrangement of an interconnect structure and ground layers of an electronic device used in the Universal Chiplet Interconnect Express (UCIe) standard in accordance with some embodiments of the disclosure.
Figure 3B:
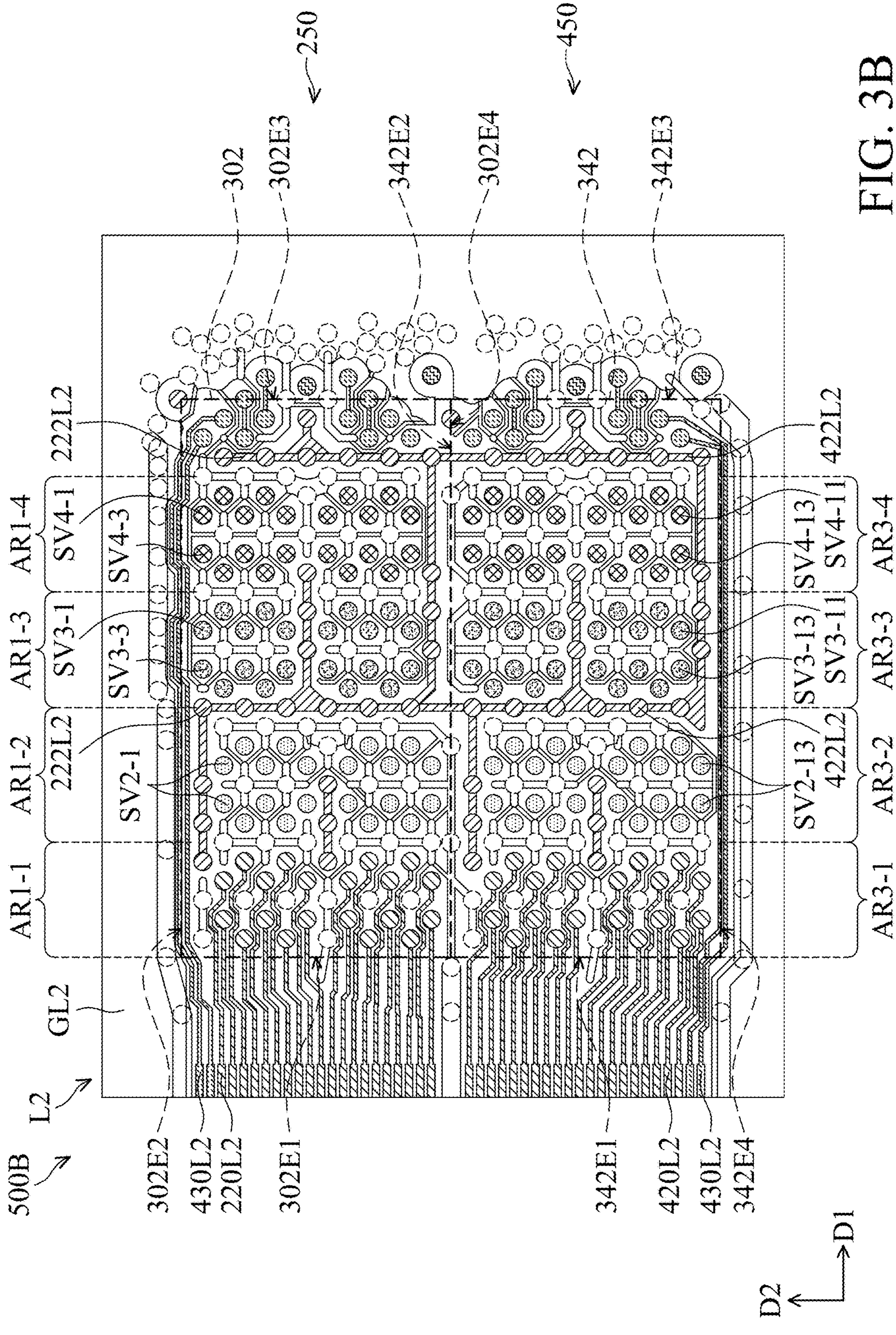
Figure 3C:
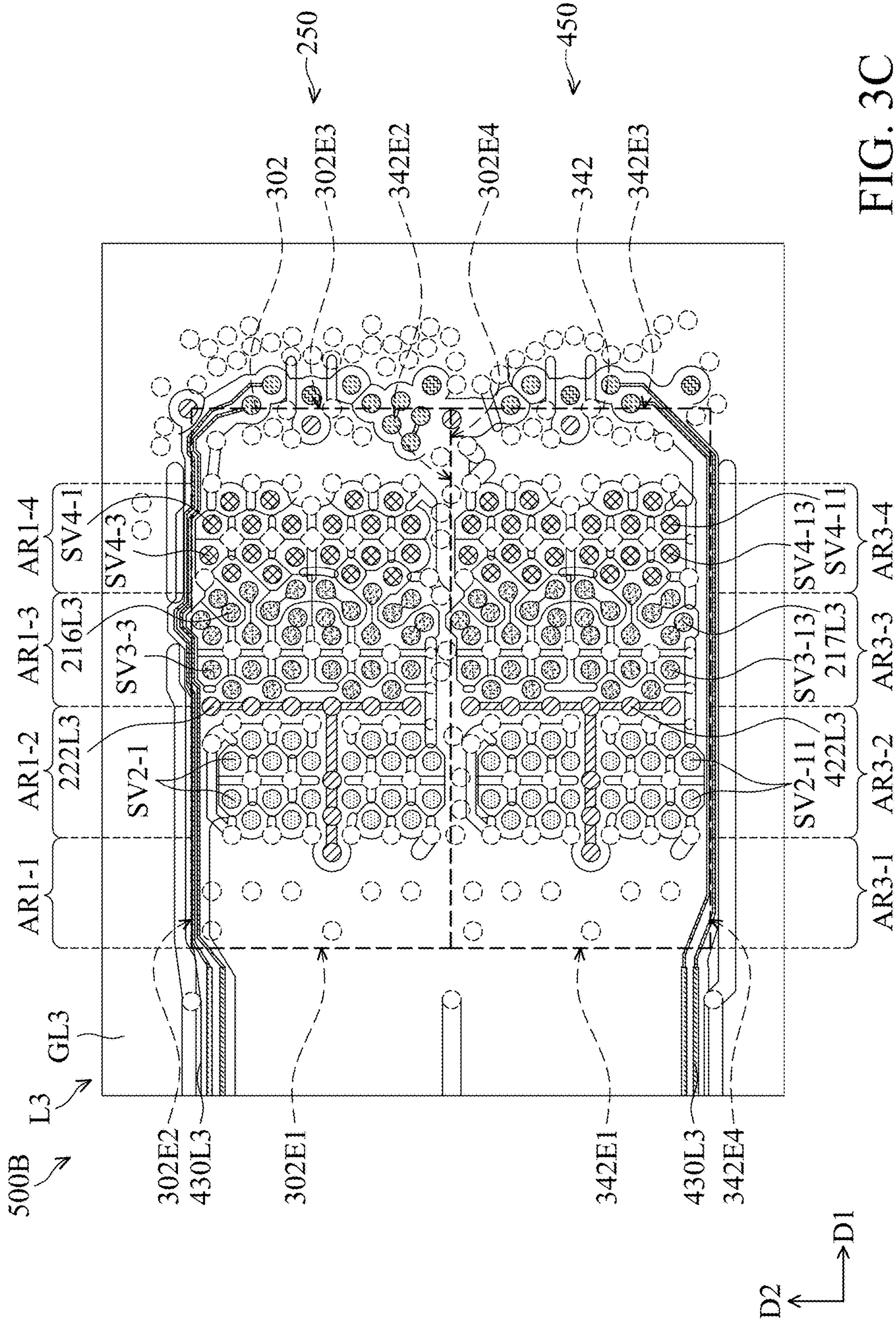
Figure 3D:
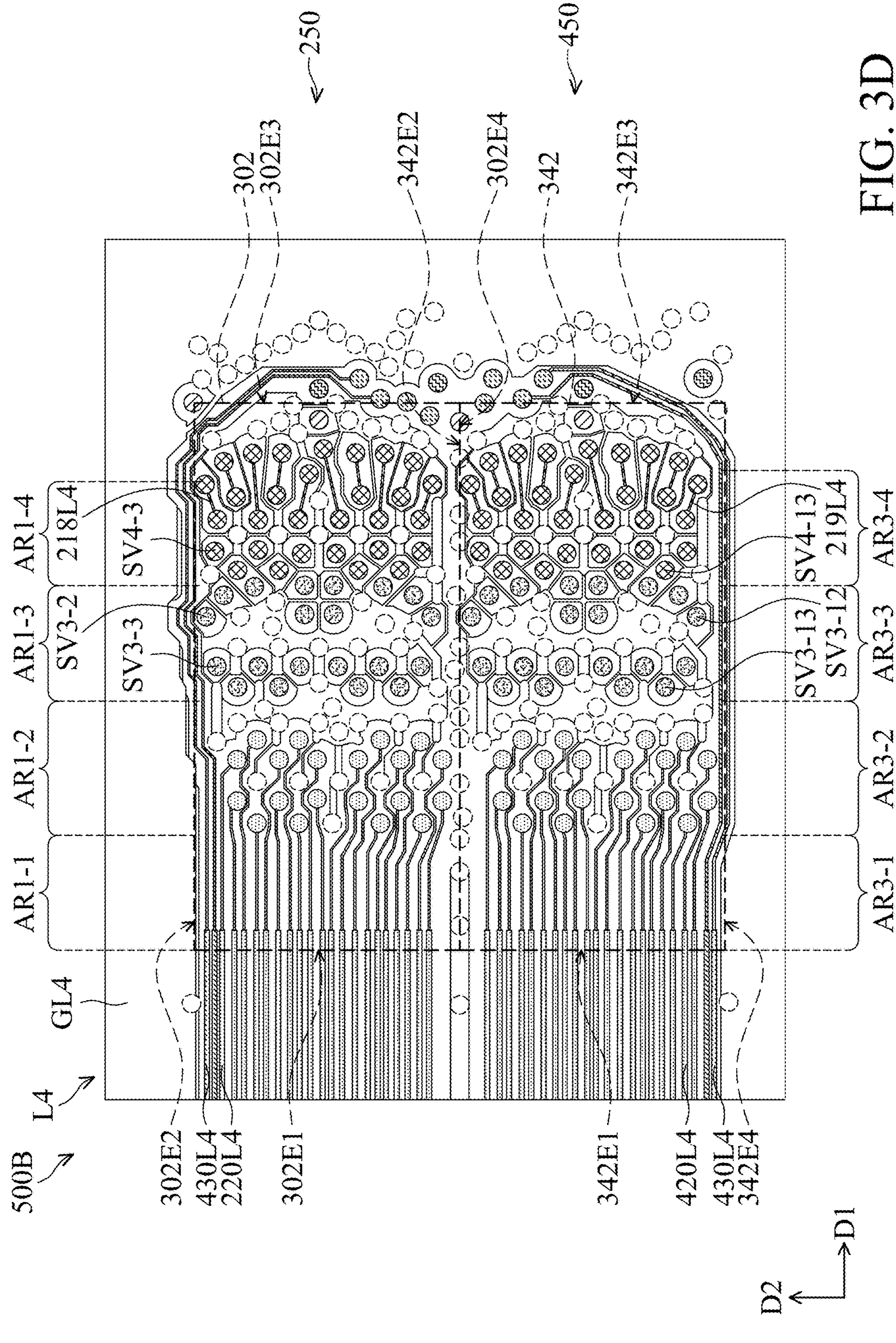
Figure 3E:
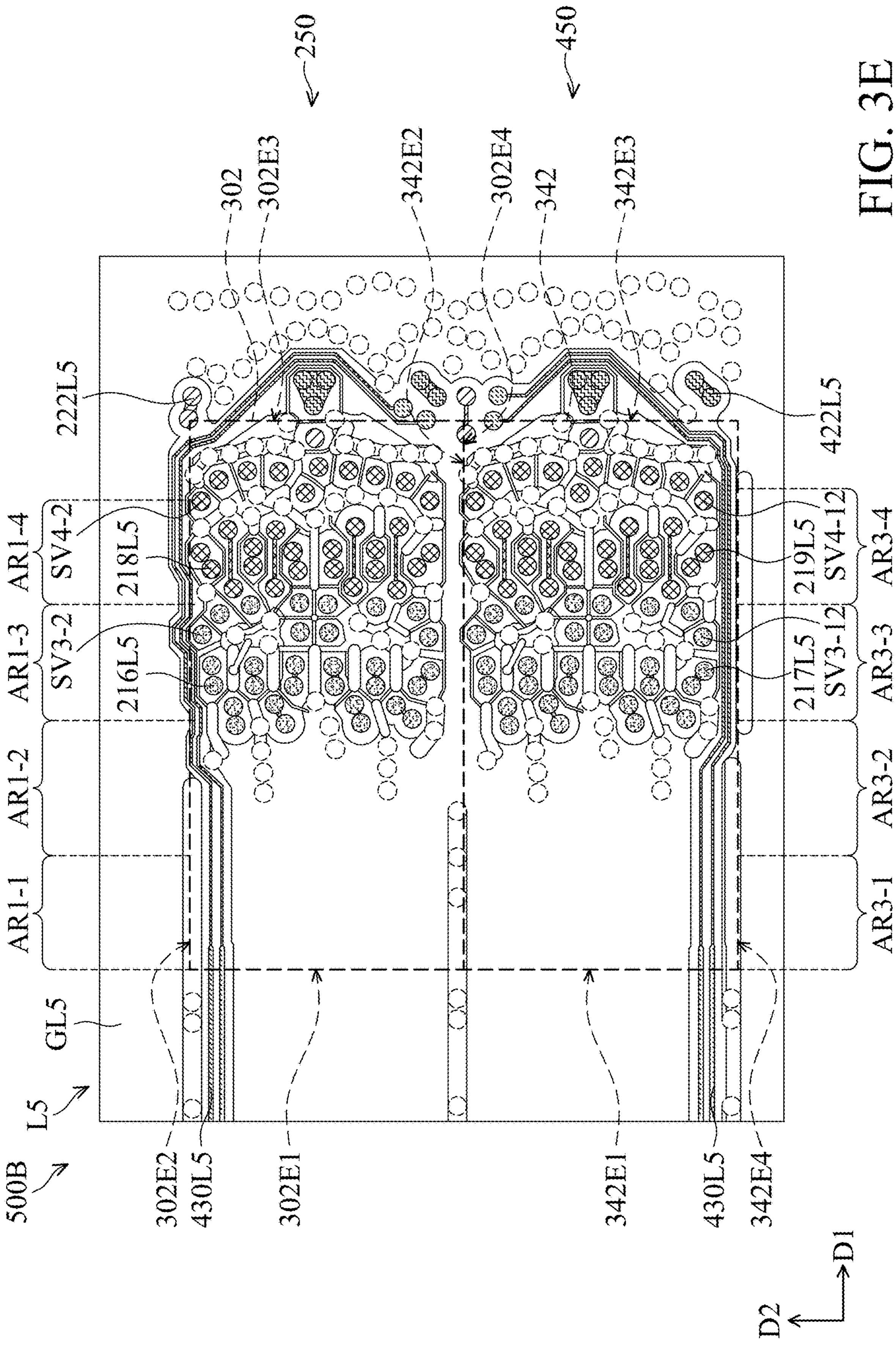
Figure 3F:
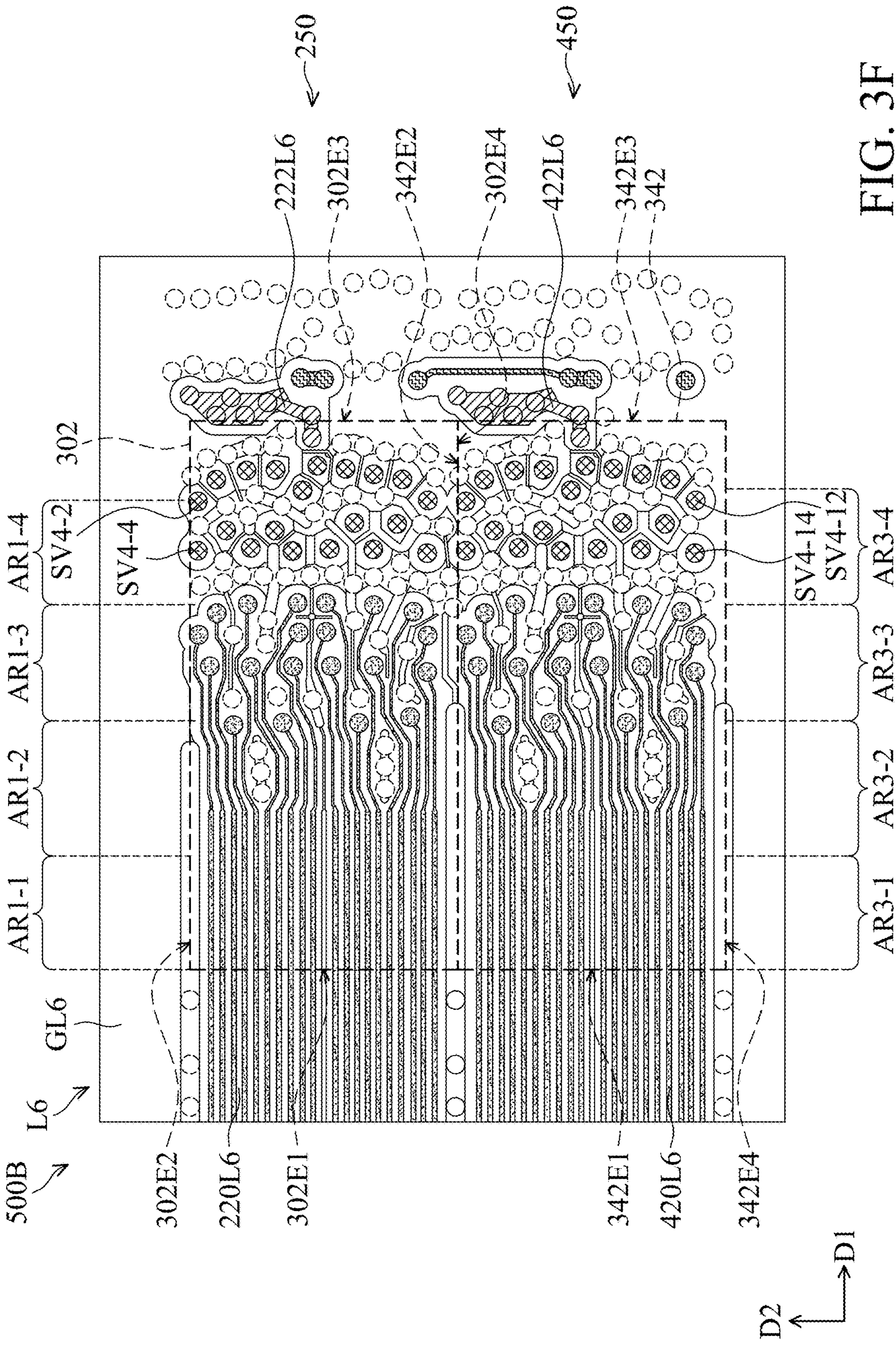
Figure 3G:
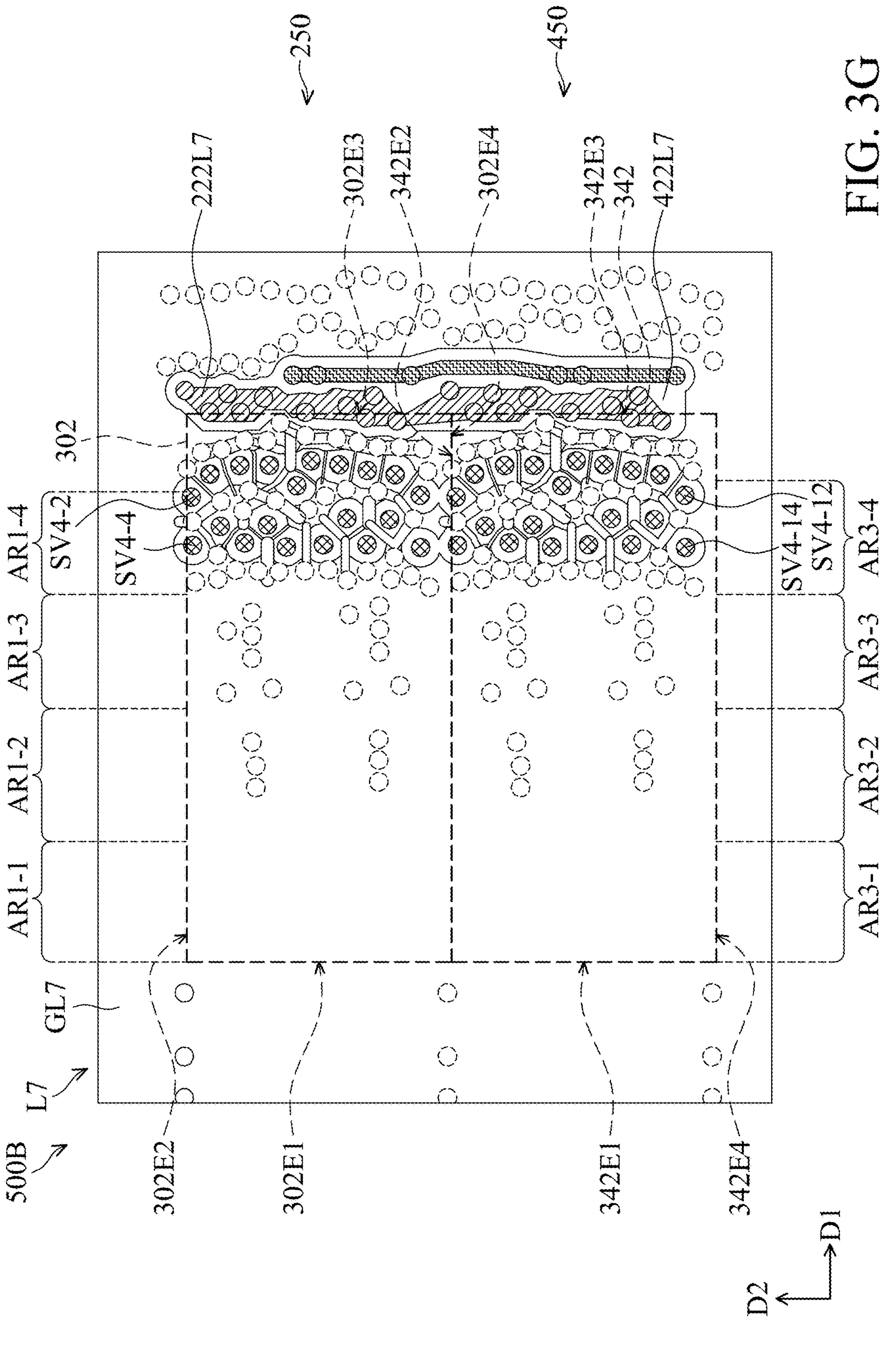
Figure 3H:
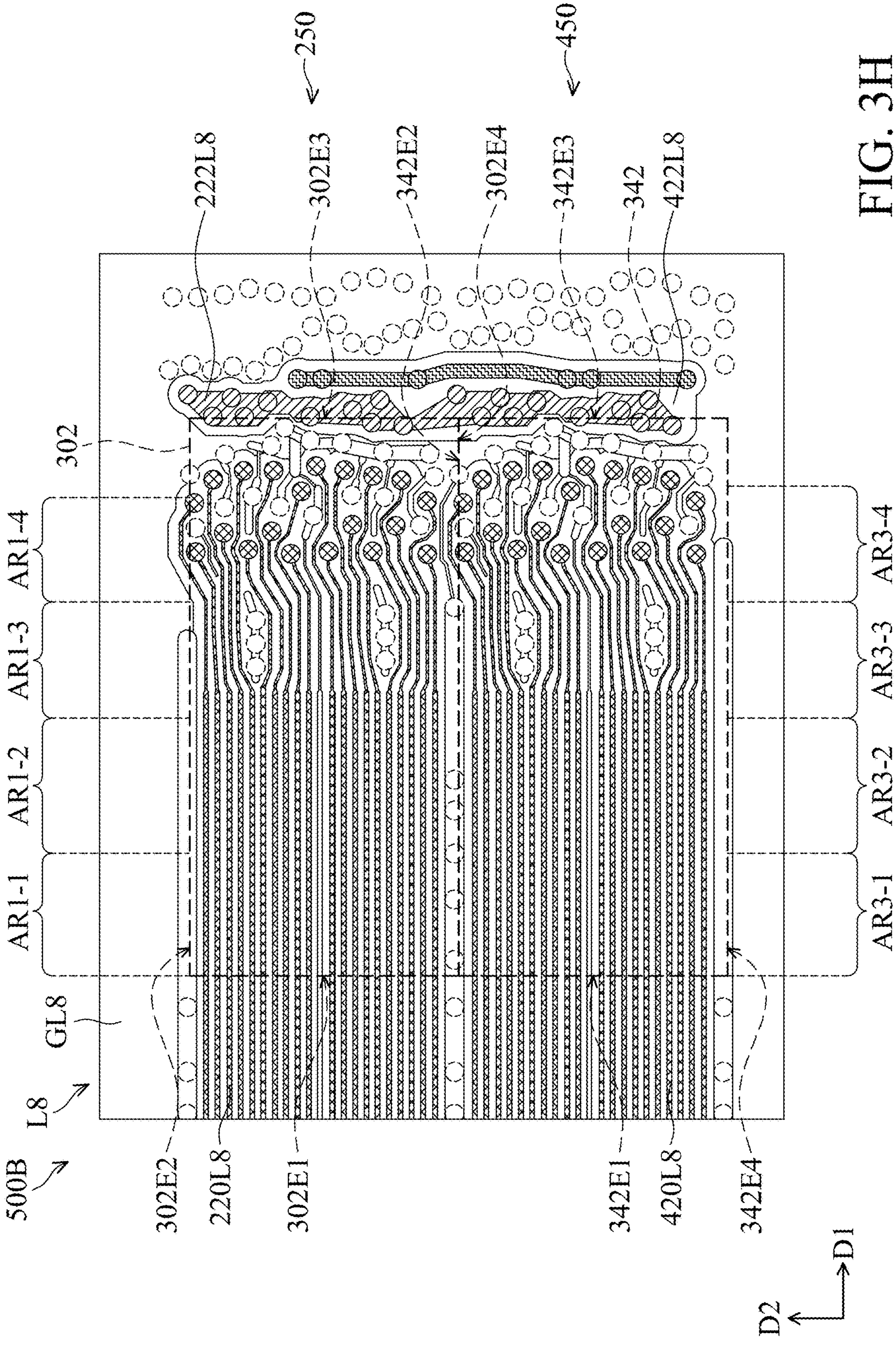

The power traces 422L1, 422L2, 422L3, 422L5, 422L6, 422L7, 422L8 are electrically connected to the power pads 224P at level LN of the substrate 200 and are surrounded by the ground layer GLN, as shown in FIG. 2I.

In some embodiments, the signal traces 430L2, 430L3, 430LA and 430L5 are arranged corresponding to the edge 302E2 of the semiconductor device 302 and the edge 342E4 of the semiconductor device 342. The signal traces 430L2, 430L3, 430LA and 430L5 are not arranged corresponding to the edge 302E4 of the semiconductor device 302 and the edge 342E2 of the semiconductor device 342. The space between the edge 302E4 of the semiconductor device 302 and the edge 342E2 of the semiconductor device 342 only allows the power traces or the ground layer disposed within. The edge 342E4 of the semiconductor device 342 may be parallel to the edge 302E4 of the semiconductor device 302. In addition, the edge 302E2 of the semiconductor device 302 and the edge 342E4 of the semiconductor device 342 are opposite to (away form) the adjacent edges 302E4 of the semiconductor device 302 and the edge 342E2 of the semiconductor device 342. The signal traces 430L2, 430L3, 430LA and 430L5 are partially covered by the semiconductor device 342 and semiconductor device 332 (or another semiconductor device located beside the semiconductor device 332). The sideband signal traces 430L2, 430L3, 430L4 and 430L5 substantially parallel to the mainland signal traces 420L2, 420L4, 420L6 and 420L8. According to the Universal Chiplet Interconnect Express (UCIe) standard, the signal traces 430L2, 430L3, 430L4 and 430L5 arranged at adjacent four levels (such as levels L2 to L5) of the substrate 200. For example, there are two signal traces 430L2 at level L2 arranged along the opposite edges 302E2 and 342E4 and extending substantially along the direction D1, so that the signal traces 220L2, 420L2, the power traces 222L2, 422L2 and the via structures SV2-1, SV3-1, SV3-3, SV4-1, SV4-3, SV2-11, SV3-11, SV3-13, SV4-11, SV4-13 are sandwiched between the signal traces 430L. There are two signal traces 430L3 at level L3 arranged along the opposite edges 302E2 and 302E4 and extending substantially along the direction D1, so that the signal traces 216L3, 416L3, the power traces 222L3, 422L3 and the via structures SV2-1, SV3-3, SV4-1, SV4-3, SV2-11, SV3-13, SV4-11, SV4-13 are sandwiched between the signal traces 430L3. There are two signal traces 430L4 at level LA arranged along the opposite edges 302E2 and 302E4 and extending substantially along the direction D1, so that the signal traces 218L4, 220L4, 418L4, 420LA and the via structures SV3-2, SV3-3, SV4-3, SV3-12, SV3-13, SV4-13 are sandwiched between the signal traces 430L4. There are two signal traces 430L5 at level L5 arranged along the opposite edges 302E2 and 302E4 and extending substantially along the direction D1, so that the signal traces 216L5, 218L5, 416L5, 418L5, the power traces 222L5, 422L5 and the via structures SV3-2, SV4-2, SV3-12, SV4-12 are sandwiched between the signal traces 430LA.

In this embodiment, the sideband signal traces 430L2, 430L3, 430L4 and 430L5 of the electronic device 500B having a multi-module design are arranged corresponding to the two side of the about IP area (such as the edge 302E2 of the semiconductor device 302 and the edge 342E4 of the adjacent semiconductor device 342). The abut issue can be improved. The space between the adjacent semiconductor device 302 and 342 can be further shrunk to reduce the total area of the electronic device 500B. It is noted that the sideband signal traces 430L2, 430L3, 430LA and 430L5 of the electronic device 500B are not arranged at the lower levels of the substrate 200, such as levels L6 to L8. Therefore, the substrate 200 may have better return paths for the signal traces located at the deeper levels of the substrate 200 (such as the signal traces 220L6, 420L6 at level L6 and the signal traces 220L8, 420L8 at level L8 of the substrate 200). Therefore, the signal and power integrity (SI/PI) problems of the signal traces located at the deeper levels of the substrate 200 can be improved.

In some embodiments, one or more additional semiconductor devices (not shown) (also called additional chiplets) arranged between the semiconductor device 302 and the semiconductor device 342 along the direction D2, so that the signal traces 430L2, 430L3, 430L4 and 430L5 are still arranged corresponding to the edge 302E2 of the semiconductor device 302 and the edge 342E4 of the semiconductor device 342. The signal traces 430L2, 430L3, 430L4 and 430L5 are not arranged corresponding to the edge 302E4 of the semiconductor device 302, the edge 342E2 of the semiconductor device 342 and edges of the additional semiconductor device parallel to the edges 302E4, 342E2. The spaces between the edge 302E4 of the semiconductor device 302 and the additional semiconductor device and between the additional semiconductor device and the edge 342E2 of the semiconductor device 342 only allow the power traces or the ground layer disposed within. In some embodiments, the additional semiconductor device may include interconnect structure electrically connected to the semiconductor device 332 or another semiconductor device located beside the semiconductor device 332 in the direction D2. The structure and arrangement of the interconnect structure of the additional semiconductor device may be the same or similar to the interconnect structures 250 and 450.

Embodiments provide an electronic device used in the Universal Chiplet Interconnect Express (UCIe) standard. The electronic device includes a substrate, a first semiconductor device and a second semiconductor device. The substrate has a top surface and a bottom surface. The first semiconductor device and the second semiconductor device are disposed on the top surface of the substrate. The substrate includes an interconnect structure electrically connected between the first semiconductor device and the second semiconductor device. The interconnect structure includes a first pad, a first signal trace, a first via structure and a second via structure. The first pad is located on the top surface of the substrate. The first pad is covered by the first semiconductor device. The first signal trace is located below the first pad and partially covered by the first semiconductor device and the second semiconductor device. The first via structure is electrically connected between the first pad and the first signal trace. The second via structure is electrically connected between the first via structure and the first signal trace. The first signal trace extends in the first direction. The first via structure and the second via structure extend in the second direction. The first via structure is misaligned with the second via structure in the second direction.

In some embodiments, the interconnect structure further includes a second signal trace located between the first via structure and the second via structure. The second signal trace extends in the first direction and is fully covered by the first semiconductor device. The first via structure is directly connected between the first pad and a first terminal of the second signal trace, and the second via structure is connected between a second terminal of the second signal trace and a first terminal of the first signal trace.

In some embodiments, the substrate is a multi-layer substrate comprising at least nine conductive layers located at a first level, a second level, a third level, a fourth level, a fifth level, a sixth level), a seventh level, an eighth level and a $N^{th}$ level (LN) of the substrate, wherein N is a positive integer greater than or equal to 9. The topmost conductive layer disposed on the top surface of the substrate is located at the first level, and a bottommost conductive layer disposed on the bottom surface of the substrate is located at the $N^{th}$ level.

In some embodiments, the first via structure is composed of a first number of stacked vias, the second via structure is composed of a second number of stacked vias. In some embodiments, each of the first number and the second number is a positive integer between 1 and 4.

In some embodiments, the sum of the first number and the second number is 5 or 7.

In some embodiments, the first pad is located in a first pad region and at the first level of the substrate, the first signal trace is located at the six level of the substrate, and the second signal substrate is located at the third level, the fourth level or the fifth level of the substrate.

In some embodiments, the first number is 2 and the second number is 3.

In some embodiments, the first number is 3 and the second number is 2.

In some embodiments, the first number is 4 and the second number is 1.

In some embodiments, the first signal trace is located at an eighth level of the substrate, and the second signal substrate is located at the fourth level or the fifth level of the substrate.

In some embodiments, the first number is 3 and the second number is 4.

In some embodiments, the first number is 4 and the second number is 3.

In some embodiments, the interconnect structure further includes a second pad, a third signal trace and a third via structure. The second pad is located beside the first pad. The second pad is covered by the first semiconductor device. The second pad is closer to a first edge of the first semiconductor die than the first pad, and the first edge of the first semiconductor die is adjacent to a second edge of the second semiconductor die. The third signal trace is located above the first signal trace and partially covered by the first semiconductor device and the second semiconductor device. The third signal trace is located above the first signal trace and partially covered by the first semiconductor device and the second semiconductor device.

In some embodiments, the third via structure is composed of a third number of stacked vias. In some embodiments, the third number is a positive integer between 1 and 4.

In some embodiments, the second pad is located in a second pad region and at the first level of the substrate, and the third signal trace is located at the second level or the fourth level of the substrate.

In some embodiments, the third number is 1 or 3.

In some embodiments, the interconnect structure further includes fourth signal traces and fifth signal traces. The fourth signal traces overlap each other and are arranged corresponding to a third edge of the first semiconductor device The fourth signal traces are partially covered by the first semiconductor device and the second semiconductor device. The fifth signal traces overlapping each other and arranged parallel to a fourth edge of the first semiconductor device. The fifth signal traces are partially covered by the first semiconductor device and the second semiconductor device. The third edge and the fourth edge are adjacent to the first edge and opposite each other, so that the first signal trace and the second signal trace are sandwiched between the fourth signal traces and the fifth signal traces.

In some embodiments, the first and second signal traces transmit signals of a first bandwidth, and the fourth and fifth signal traces transmit signals of a second bandwidth that is lower than the first bandwidth.

In some embodiments, the electronic device further includes a third semiconductor device disposed on the top surface of the substrate and beside the fourth edge of the first semiconductor die. The fifth signal traces are arranged corresponding to the fifth edge of the third semiconductor die, and the fifth edge is opposite to the fourth edge of the first semiconductor die.

In some embodiments, the fourth and fifth signal traces are located at the second level, the third level, the fourth level and the fifth level of the substrate.

Compared with the conventional interconnect structure used in the Universal Chiplet Interconnect Express (UCIe) standard which uses a single via structure composed of at least 5 stacked vias connected between the pad at level L1 and the signal trace located at deeper levels (such as level L6 or level L8), the electronic device uses an additional signal trace (segment) to divided the conventional single via structure into several misaligned via structures composed of less than 5 stacked vias. The misaligned via structures are directly connected between the first terminal of the additional signal trace and the corresponding pad, and between the second terminal of the additional signal trace and the signal trace located at deeper levels. In addition, the misaligned via structures have a reduced number of stacked vias (less than 5) and are surrounded by the corresponding ground layers to ensure the SI/PI performance. The misaligned via structures have advantages of reduced fabrication cost and lower manufacturing processing requirements.

In some embodiments, the sideband signal traces (transmitting signals of the second bandwidth) of the electronic device are not arranged at the lower levels of the substrate, such as the sixth level to the eighth level. Therefore, the substrate may have better return paths for the signal traces located at the deeper levels of the substrate (such as the signal traces 220L6, 420L6 at level L6 and the signal traces 220L8, 420L8 at level L8 of the substrate 200 of the electronic devices 500A and 500B). Therefore, the signal and power integrity (SI/PI) problems of the signal traces located at the deeper levels of the substrate can be improved.

In some embodiments, the sideband signal traces of the electronic device having a multi-module design are arranged corresponding to the two side of the about IP area (such as the edge 302E2 of the semiconductor device 302 and the edge 342E4 of the adjacent semiconductor device 342 of the electronic device 500B). The abut issue can be improved. The space between the adjacent semiconductor devices can be further shrunk to reduce the total area of the electronic device.

While the disclosure has been described by way of example and in terms of the preferred embodiments, it should be understood that the disclosure is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An electronic device used in the Universal Chiplet Interconnect Express (UCIe) standard, comprising:
- a substrate having a top surface and a bottom surface; and
- a first semiconductor device and a second semiconductor device disposed on the top surface of the substrate,
- wherein the substrate comprises an interconnect structure electrically connected between the first semiconductor device and the second semiconductor device, wherein the interconnect structure comprises:
  - a first pad located on the top surface of the substrate, wherein the first pad is covered by the first semiconductor device;
  - a first signal trace located below the first pad and partially covered by the first semiconductor device and the second semiconductor device;
  - a first via structure electrically connected between the first pad and the first signal trace; and
  - a second via structure electrically connected between the first via structure and the first signal trace,
  - wherein the first signal trace extends in a first direction, the first via structure and the second via structure extend in a second direction, and the first via structure is misaligned with the second via structure in the second direction.

2. The electronic device as claimed in claim 1, wherein the interconnect structure further comprises:

a second signal trace located between the first via structure and the second via structure, wherein the second signal trace extends in the first direction and is fully covered by the first semiconductor device, wherein the first via structure is directly connected between the first pad and a first terminal of the second signal trace, and the second via structure is connected between a second terminal of the second signal trace and a first terminal of the first signal trace.

3. The electronic device as claimed in claim 2, wherein the substrate is a multi-layer substrate comprising at least nine conductive layers located at a first level, a second level, a third level, a fourth level, a fifth level, a sixth level, a seventh level, an eighth level and a $N^{th}$ level of the substrate, wherein N is a positive integer greater than or equal to 9, wherein a topmost conductive layer disposed on the top surface of the substrate is located at the first level, and a bottommost conductive layer disposed on the bottom surface of the substrate is located at the $N^{th}$ level.

4. The electronic device as claimed in claim 3, wherein the first via structure is composed of a first number of stacked vias, the second via structure is composed of a second number of the stacked vias, and each of the first number and the second number is a positive integer between 1 and 4.

5. The electronic device as claimed in claim 4, wherein the sum of the first number and the second number is 5 or 7.

6. The electronic device as claimed in claim 5, wherein the first pad is located in a first pad region and at the first level of the substrate, the first signal trace is located at the six level of the substrate, and the second signal substrate is located at the third level, the fourth level or the fifth level of the substrate.

7. The electronic device as claimed in claim 6, wherein the first number is 2 and the second number is 3.

8. The electronic device as claimed in claim 6, wherein the first number is 3 and the second number is 2.

9. The electronic device as claimed in claim 6, wherein the first number is 4 and the second number is 1.

10. The electronic device as claimed in claim 5, wherein the first signal trace is located at the eighth level of the substrate, and the second signal substrate is located at the fourth level or the fifth level of the substrate.

11. The electronic device as claimed in claim 10, wherein the first number is 3 and the second number is 4.

12. The electronic device as claimed in claim 10, wherein the first number is 4 and the second number is 3.

13. The electronic device as claimed in claim 3, wherein the interconnect structure further comprises:

a second pad located beside the first pad, wherein the second pad is covered by the first semiconductor device, wherein the second pad is closer to a first edge of the first semiconductor die than the first pad, and the first edge of the first semiconductor die is adjacent to a second edge of the second semiconductor die;

a third signal trace located above the first signal trace and partially covered by the first semiconductor device and the second semiconductor device; and a third via structure connected between a second pad and a first terminal of the third signal trace.

14. The electronic device as claimed in claim 13, wherein the third via structure is composed of a third number of stacked vias, and the third number is a positive integer between 1 and 4.

15. The electronic device as claimed in claim 14, wherein the second pad is located in a second pad region and at the first level of the substrate, and the third signal trace is located at the second level or the fourth level of the substrate.

16. The electronic device as claimed in claim 15, wherein the third number is 1 or 3.

17. The electronic device as claimed in claim 3, wherein the interconnect structure further comprises:

fourth signal traces overlapping each other and arranged corresponding to a third edge of the first semiconductor device, wherein the fourth signal traces are partially covered by the first semiconductor device and the second semiconductor device; and fifth signal traces overlapping each other and arranged parallel to a fourth edge of the first semiconductor device, wherein the fifth signal traces are partially covered by the first semiconductor device and the second semiconductor device, and wherein the third edge and the fourth edge are adjacent to the first edge and opposite each other, so that the first signal trace and the second signal trace are sandwiched between the fourth signal traces and the fifth signal traces.

18. The electronic device as claimed in claim 17, wherein the first and second signal traces transmit signals of a first bandwidth, and the fourth and fifth signal traces transmit signals of a second bandwidth that is lower than the first bandwidth.

19. The electronic device as claimed in claim 17, further comprising:

a third semiconductor device disposed on the top surface of the substrate and beside the fourth edge of the first semiconductor die, wherein the fifth signal traces are arranged corresponding to a fifth edge of the third semiconductor die, and the fifth edge is opposite to the fourth edge of the first semiconductor die.

20. The electronic device as claimed in claim 17, wherein the fourth and fifth signal traces are located at the second level, the third level, the fourth level and the fifth level of the substrate.

* * * * *